(12) United States Patent
Ma et al.

(10) Patent No.: US 8,294,602 B2
(45) Date of Patent: Oct. 23, 2012

(54) CODING METHOD, DECODING METHOD, CODER AND DECODER

(75) Inventors: Fuwei Ma, Shenzhen (CN); Dejun Zhang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 444 days.

(21) Appl. No.: 12/607,723

(22) Filed: Oct. 28, 2009

(65) Prior Publication Data
US 2010/0049511 A1 Feb. 25, 2010

Related U.S. Application Data

(63) Continuation of application No. PCT/CN2008/070841, filed on Apr. 29, 2008.

(30) Foreign Application Priority Data

Apr. 29, 2007 (CN) .......................... 2007 1 0103023
Sep. 15, 2007 (CN) .......................... 2007 1 0153952

(51) Int. Cl.
H03M 7/00 (2006.01)
(52) U.S. Cl. ............ 341/50; 704/212; 704/223; 341/66; 341/70
(58) Field of Classification Search .............. 341/50–70; 704/212–223, E19.033, E19.035, E19.044
See application file for complete search history.

(56) References Cited

U.S. PATENT DOCUMENTS

| 6,847,929 | B2 | 1/2005 | Bernard |
| 2002/0111799 | A1 | 8/2002 | Bernard |
| 2005/0065785 | A1 | 3/2005 | Bessette |
| 2006/0116872 | A1 | 6/2006 | Byun et al. |
| 2007/0124138 | A1 | 5/2007 | Lamblin et al. |
| 2009/0248406 | A1* | 10/2009 | Zhang et al. .................. 704/223 |

FOREIGN PATENT DOCUMENTS

| CN | 1395724 A | 2/2003 |
| CN | 1811917 A | 8/2006 |
| CN | 1890713 A | 1/2007 |
| CN | 101295506 B | 11/2011 |
| JP | 11-296195 A | 10/1999 |

(Continued)

OTHER PUBLICATIONS

International Search Report in corresponding PCT Application No. PCT/CN2008/070841 (Jul. 17, 2008).

(Continued)

*Primary Examiner* — Lam T Mai
(74) *Attorney, Agent, or Firm* — Leydig, Voit & Mayer, Ltd.

(57) ABSTRACT

A coding method, a decoding method, a coder, and a decoder are disclosed herein. A coding method includes: obtaining the pulse distribution, on a track, of the pulses to be encoded on the track; determining a distribution identifier for identifying the pulse distribution according to the pulse distribution; and generating a coding index that includes the distribution identifier. A decoding method includes: receiving a coding index; obtaining a distribution identifier from the coding index, wherein the distribution identifier is configured to identify the pulse distribution, on a track, of the pulses to be encoded on the track; determining the pulse distribution, on a track, of all the pulses to be encoded on the track according to the distribution identifier; and reconstructing the pulse order on the track according to the pulse distribution.

17 Claims, 15 Drawing Sheets

FOREIGN PATENT DOCUMENTS

| | | |
|---|---|---|
| JP | 2004-120623 A | 4/2004 |
| JP | 2007515676 A | 6/2007 |
| WO | WO 2005/066936 A1 | 7/2005 |

OTHER PUBLICATIONS

1st Office Action in corresponding Chinese Application No. 200710153952.7 (May 13, 2011).

Written Opinion in counterpart PCT Application No. PCT/CN2008/070841, mailed Jul. 17, 2008.

Extended European Search Report in counterpart European Application No. 08734199.6-2225, mailed Jun. 30, 2010.

Hung, Andy C., et al. [of Computer Systems Laborator—Stanford University, Stanford, CA], "Error Resilient Pyramid Vector Quantization for Image Compression," *IEEE*, 1994.

Mittal, Udar, et al. [of Motorola Labs, Schaumburg, IL], "Coding Unconstrained FCB Excitation Using Combinatorial and Huffman Codes," *IEEE*, 2002.

"Digital cellular telecommunications system (Phase 2+); Universal Mobile Telecommunications System (UMTS); Mandatory Speech Codec speech processing functions—AMR Wideband speech codec; Transcoding functions (3GPP TS 26.190 version 6.0.0 Release 6)," *3GPP*, ETSI TS 126 190 V6.0.0 (Dec. 2004).

Rejection Decision in corresponding Japanese Patent Application No. 2010-504431 (Jan. 17, 2012).

Guerchi, D., et al., "Multi-Track Codebook in Low-Rate CELP Coding," pp. 671-675, IEEE ISIE 2006, Montreal, Quebec, Canada.

Hung, Andy C., et al., "Error-Resilient Pyramid Vector Quantization for Image Compression," pp. 1373-1386, IEEE Transactions on Image Processing, Vo., 7, No. 10, Oct. 1998.

Mittal et al., "Coding Unconstrained FCB Excitation Using Cominatorial and Huffman Codes," Motorola Labs, 2002, Institute of Electronic and Electrical Engineers, Schaumburg, Illinois.

"3GPP TS 26.190—3$^{rd}$ Generation Partnership Project; Technical Specification Group Services and System Apsects; Speech codec speech processing function; Adaptive Multi-Rate Wideband (AMR-WB) speech codec; Transcoding functions (Release 6)," Dec. 2004, Version 6.0.0, 3$^{rd}$ Generation Partnership Project, Valbonne, France.

\* cited by examiner

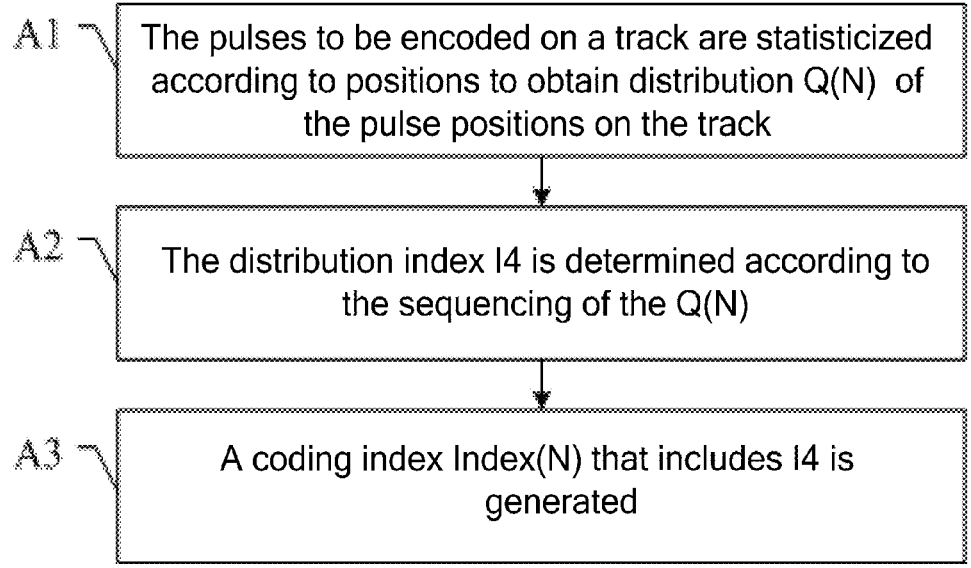
FIG. 1
| N | Coding value range | Bit (bit) | | | | | | |
|---|---|---|---|---|---|---|---|---|
| | | 18 | ... | 5 | 4 | 3 | 2 | 1 | 0 |
| 5 | 0x00000–0x7FFFF | I4(5) | | | ss(0) | ss(1) | ss(2) | ss(3) | ss(4) |
FIG. 2
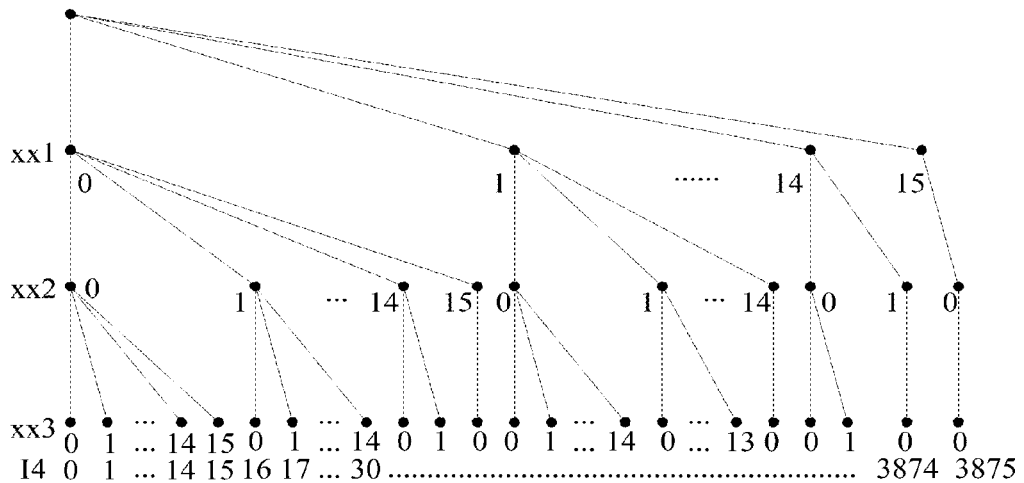
FIG. 3

| N | i | Bit (bit) | | | | | | | | | | | | | | | | | | | | |
|---|---|---|---|---|---|---|---|---|---|---|---|---|---|---|---|---|---|---|---|---|---|---|
| | | 20 | 19 | 18 | 17 | 16 | 15 | 14 | 13 | 12 | ... | 6 | 5 | 4 | 3 | 2 | 1 | 0 | | | | |
| 6 | 0x100000 | 1 | 0 | | | | | I23(0) = I2(0) | | | | s(0) | s(1) | s(2) | s(3) | s(4) | s(5) | | | | |
| 5 | 0x0C0000 | 0 | | | | | I23(5) = I3(5) × 4368 + I2(5) | | | | | | s(0) | s(0) | s(1) | s(2) | s(3) | s(4) | s(5) | | | |
| 4 | 0x1C0000 | 1 | 1 | 1 | | | I23(4) = I3(4) × 1820 + I2(4) | | | | | | | s(0) | s(1) | s(2) | s(3) | s(4) | | | |
| 3 | 0x1D0000 | 1 | 1 | 1 | 0 | 1 | 0......0 | | | | | | | | s(0) | s(1) | s(2) | s(3) | | | |
| 2 | 0x1E0000 | 1 | 1 | 1 | 1 | 0 | 0......0 | | | | I23(2) = I3(2) × 120 + I2(2) | | | | | s(0) | s(1) | s(2) | | | |
| 1 | 0x1F0000 | 1 | 1 | 1 | 1 | 1 | 0......0 | | | | I23(1) = I2(1) | | | | | | s(0) | s(1) | | | |

FIG. 5

| N | I1 | Bit (bit) | | | | | | | | | | | | | | | | | | |
|---|---|---|---|---|---|---|---|---|---|---|---|---|---|---|---|---|---|---|---|---|
| | | 18 | 17 | 16 | 15 | 14 | 13 | 12 | 11 | 10 | ... | 6 | 5 | 4 | 3 | 2 | 1 | 0 |
| 5 | 0x00000 | 0 | 0 | 0 | 0 | \multicolumn{6}{c}{I23(5) = I2(5)} | | | | s(0) | s(1) | s(2) | s(3) | s(4) |
| 4 | 0x40000 | 1 | 0 | 0 | 0 | \multicolumn{6}{c}{I23(4) = I3(4) × 1820 + I2(4)} | | | s(0) | s(1) | s(2) | s(3) |
| 3 | 0x60000 | 1 | 1 | 1 | 0 | \multicolumn{6}{c}{I23(3) = I3(3) × 560 + I2(3)} | | s(0) | s(1) | s(2) |
| 2 | 0x70000 | 1 | 1 | 1 | 1 | \multicolumn{6}{c}{I23(2) = I3(2) × 120 + I2(2)} | s(0) | s(1) |
| 1 | 0x78000 | 1 | 1 | 1 | 1 | \multicolumn{6}{c}{0 ... 0} | I23(1) = I2(1) |

FIG. 6

CODING METHOD, DECODING METHOD, CODER AND DECODER

CROSS-REFERENCE TO RELATED APPLICATIONS

This application is a continuation of International Patent Application No. PCT/CN2008/070841, filed Apr. 29, 2008, which claims priority to Chinese Patent Application No. 200710103023.5, filed Apr. 29, 2007 and Chinese Patent Application No. 200710153952.7, filed Sep. 15, 2007, all of which are hereby incorporated by reference in their entireties.

FIELD OF THE INVENTION

The present invention relates to a coding method, a decoding method, a coder, and a decoder.

BACKGROUND

In the vector coding technology, residual signals subsequent adaptive filtering generally undergo quantization coding by using algebraic codebooks. After the information about the position and the sign of the optimum algebraic codebook pulse on the track is searched out, the corresponding index value is calculated out through coding so that the decoder can reconstruct a pulse order according to the index value. One of the main objectives of researching and developing the algebraic codebook pulse coding method is to minimize the bits required by the coding index value on the precondition of ensuring lossless reconstruction.

The Extended Adaptive Multi-Rate Wideband (AM-R_WB+) coding method is an algebraic codebook pulse coding method in the conventional art. Depending on the coding rate, one to N pulses may be encoded on each track. With the increase of coding pulses, the bits required for encoding such an amount of pulses also increase. For example, for a track with $M=2^m$ positions, encoding one pulse on the track requires m+1 bits, and encoding six pulses on the track requires 6 m−2 bits. In the process of developing the present invention, the inventor finds that in the algebraic pulse coding in the conventional art, a recursion-like coding method is applied to break down a coding pulse with many pulses into several coding pulses with fewer pulses, thus making the coding process rather complex. Meanwhile, with the increase of coding pulses on the track, the redundancy of the coding index accrues, thus tending to cause waste of coding bits.

SUMMARY

A coding method, a decoding method, a coder, and a decoder capable of saving coding bits effectively are disclosed in an embodiment of the present invention.

A coding method is disclosed according to an embodiment of the present invention. The coding method includes: (1) obtaining a pulse distribution, on a track, of pulses to be encoded on the track; (2) determining a distribution identifier for identifying the pulse distribution according to the pulse distribution; and (3) generating a coding index including the distribution identifier.

A decoding method is disclosed according to an embodiment of the present invention. The decoding method includes: (1) receiving a coding index; (2) obtaining a distribution identifier from the coding index, where the distribution identifier is configured to identify a pulse distribution, on a track, of pulses encoded on the track; (3) determining the pulse distribution, on the track, of all the pulses encoded on the track, according to the distribution identifier; and (4) reconstructing a pulse order on the track according to the pulse distribution.

A coder is disclosed according to an embodiment of the present invention. The coder includes: (1) a pulse distribution obtaining unit, adapted to obtain a pulse distribution, on a track, of pulses to be encoded on the track; (2) a distribution identifier determining unit, adapted to determine a distribution identifier for identifying the pulse distribution according to the pulse distribution obtained by the pulse distribution obtaining unit; and (3) a coding index generating unit, adapted to generate a coding index including the distribution identifier determined by the distribution identifier determining unit.

A decoder is disclosed according to an embodiment of the present invention. The decoder includes: (1) a coding index receiving unit, adapted to receive a coding index; (2) a distribution identifier extracting unit, adapted to obtain a distribution identifier from the coding index received by the coding index receiving unit, where the distribution identifier is configured to identify a pulse distribution, on a track, of pulses encoded on the track; (3) a pulse distribution determining unit, adapted to determine the pulse distribution, on the track, of all the pulses encoded on the track, according to the distribution identifier obtained by the distribution identifier extracting unit; and (4) a pulse order reconstructing unit, adapted to reconstruct a pulse order on the track, according to the pulse distribution determined by the pulse distribution determining unit.

In the embodiments of the present invention, the coding index may carry a distribution identifier for identifying the pulse distribution, and break down a coding pulse with many pulses into several coding pulses with fewer pulses. In this way, a coding index includes less information, and therefore, the coding index requires fewer bits, thus simplifying the coding process, reducing coding redundancy, and saving coding bits.

BRIEF DESCRIPTION OF THE DRAWINGS

FIG. 1 is a flowchart of a coding method according to a first embodiment of the present invention;

FIG. 2 shows a structure of a 5-pulse coding index according to the first embodiment of the present invention;

FIG. 3 shows a structure of an XX(N) tree in the case of N=3 according to a second embodiment of the present invention;

FIG. 5 shows a structure of a 6-pulse coding index according to the third embodiment of the present invention;

FIG. 6 shows a structure of a 5-pulse coding index according to the third embodiment of the present invention;

DETAILED DESCRIPTION

Figure 4:
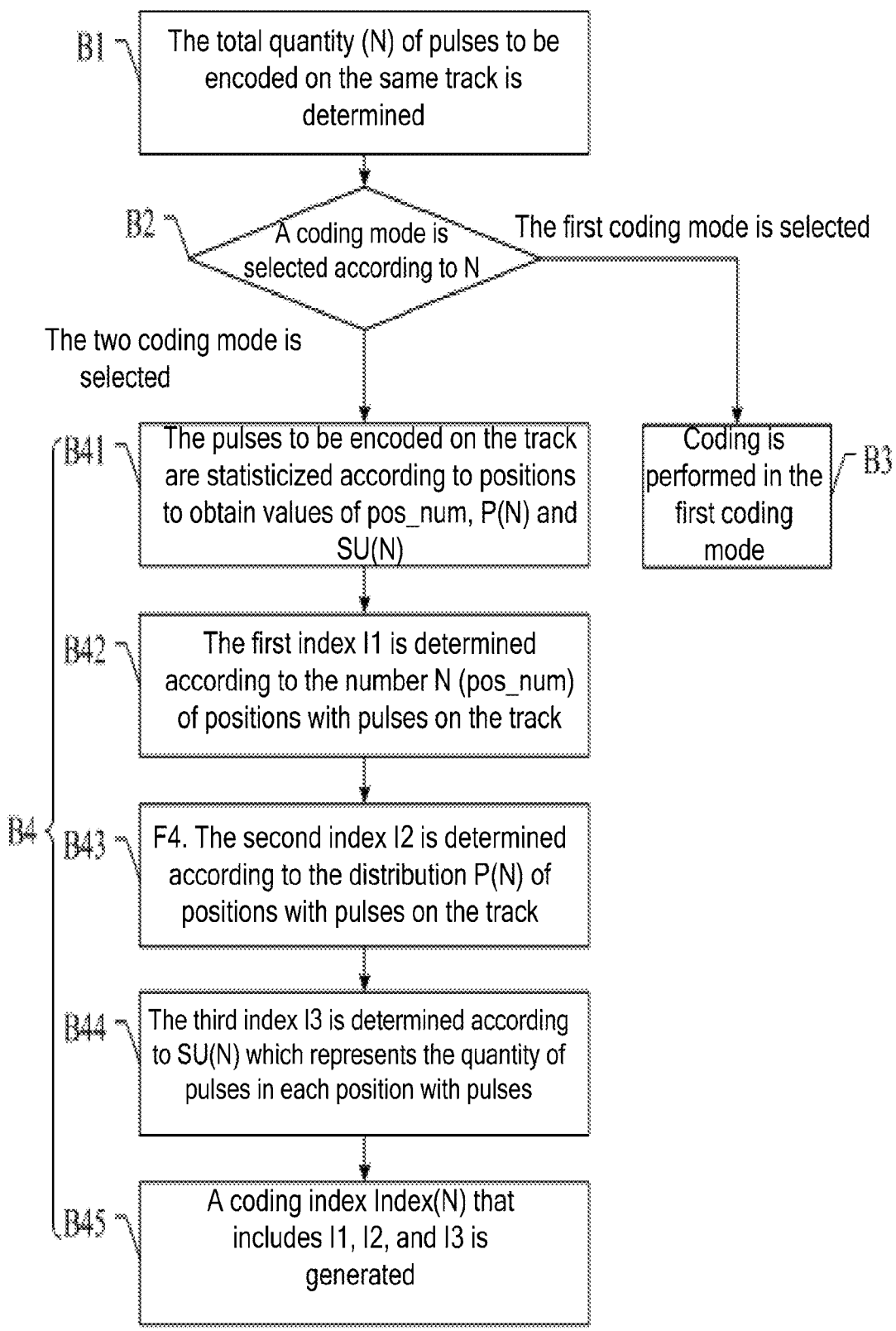
FIG. 4 is a flowchart of a coding method according to a third embodiment of the present invention.

The methods and the apparatuses under the present invention are detailed below.

A coding method is disclosed in the first embodiment of the present invention. As shown in FIG. 1, the coding method includes the following steps:

A1: Statistics about the positions of the pulses to be encoded on a track are collected to obtain the distribution of the pulse positions on the track.

The total quantity of pulses to be encoded on the same track generally depends on the code rate. In this embodiment, pulse_num represents the total quantity of pulses to be encoded on the same track, and it is assumed that pulse_num=N; and a pulse distribution vector Q(N) indicates how each the pulse position is distributed on the track, and $Q(N)=\{q(0), q(1), \ldots, q(N-1)\}$, where q(h) is a serial number of the position for the $(h+1)^{th}$ pulse on the track, h∈[0, N−1], q(h)∈[0, M−1], and M represents the total quantity of positions on the track, for example, M=8, M=16, and so on.

Besides, a pulse to be encoded may carry a sign, namely, a positive sign or a negative sign. In this case, the pulse sign information of each pulse needs to be obtained at the time of collecting statistics about the pulse positions to be encoded on the track. In this embodiment, the pulse sign information of each pulse is represented by a pulse sign vector, namely, $SS(N)=\{ss(0), ss(1), \ldots, ss(N-1)\}$, where ss(h) represents the pulse sign for the $(h+1)^{th}$ pulse, and is known as a sign index of the q(h) pulse. The pulse sign represented by ss(h) may be a positive value or a negative value. A simple coding mode is generally applied, namely, ss(h)=0 represents a positive pulse and ss(h)=1 represents a negative pulse. Nevertheless, for the pulses to be encoded, pulse signs are not a mandatory feature. As specifically required, a pulse may have only the position feature and the quantity feature. In this case, it is not necessary to collect statistics about the pulse sign information.

Evidently, a one-to-one corresponding relation may exist between Q(N) and SS(N).

After the parameters such as Q(N) and SS(N) of the pulses to be encoded are obtained through statistics, the parameters may be encoded into indices, and a corresponding relation is established between the parameter and the index so that the decoder can recover a parameter according to the corresponding index. In the present invention, a corresponding relation may be expressed in two modes. One is a calculation relation denoted by an algebraic mode, where the coder performs forward calculation for the parameter to obtain the index, and the decoder performs reverse calculation for the index to obtain the parameter; and the other is a query relation denoted by a mapping mode, where a mapping table that correlates the parameter with the index needs to be stored in both the coder and the decoder. A corresponding relation may be selected among the foregoing two corresponding relations according to the characteristics of the parameter. Generally, when the data quantity is large, the corresponding relation denoted by a calculation relation is preferred because it saves the storage space of the coder and the decoder.

A2: The distribution index (also referred to as distribution identifier) I4 is determined. The I4 may be calculated in this way: All possible distributions of the positions of all the pulses on the track are permuted in a set order, supposing that the current quantity of pulses is N; and the permuting number in the permutation serves as a distribution index I4 indicative of the distribution.

The "set order" may be understood as an order of all possible Q(N) values determined by the coder and the decoder according to the same sequencing calculation rule.

The total quantity of possible values of the pulse distribution vector Q(N) is $WQ(N)=C_{PPT}^{N}$, where PPT=M+N−1, and C refers to calculating the combination function. Each I4 corresponds to a pulse distribution in the WQ(N).

Generally, the WQ(N) is a large data quantity. Therefore, a calculation relation is preferred as a corresponding relation with the distribution index I4. Nevertheless, it is also practicable to express the corresponding relation through a query relation. Evidently, WQ(N) is the total quantity of all possible values of I4. If the value of I4 starts from 0, I4∈[0, WQ(N)−1].

A3: A coding index, namely, Index(N), is generated. The Index(N) includes information about the distribution index I4.

The I4 may be placed into the coding index in any mode identifiable to the decoder, for example, by placing the I4 into the positions that start from a set position of the coding index, which is the simplest mode.

Nevertheless, in the case that the pulse being encoded includes a sign, the Index(N) also needs to carry information about the sign index, namely, ss(h), of each pulse. The pulse sign vector SS(N) may be simply placed as a field with a length of N into a fixed position of the coding index, for example, at the end of the coding index.

To sum up, a mode of constructing the Index(N) may be:

$$\text{Index}(N) = I4 \times 2^N + ss(0) \times 2^{N-1} + ss(1) \times 2^{N-2} + \ldots + ss(N-1).$$

It is easily understandable that the mode of constructing a coding index described above is only an example of this embodiment. In practice, it is easy to derive other modes of constructing a coding index structure from the basic information about the coding index structure, for example, by swapping or recombining the index positions. The mode of constructing a coding index does not constitute any limitation to the embodiments of the present invention.

Examples are given below in order to further facilitate the understanding of the mode of constructing a coding index in the first embodiment of the present invention, supposing that the total quantity of positions on the track is M=16.

EXAMPLE 1

N=5 pulses with signs are encoded. FIG. 2 shows the structure of the coding index.

The coding index, namely, Index(5), occupies 19 bits in total. That is, Index(5)∈[0, $2^{19}$−1]. The coding value range of the Index(5) in FIG. 2 is hexadecimal. In this embodiment, the value preceded by "0x" means that the value is hexadecimal. Other values are decimal unless otherwise specified.

Five sign indices, namely, ss(0)~ss(4), occupy five bits at the end.

In FIG. 2, a space of 14 bits is available to the I4. Therefore, the coding space length available to the I4 is $2^{14}$=16384, which is enough because $WQ(5)=C_{16+5-1}^{5}=15504$.

EXAMPLE 2

N=4 pulses with signs are encoded. The structure of the coding index is as follows:

The coding index, Index(4), occupies 16 bits in total. That is, Index(4)∈[0, $2^{16}-1$]

Four sign indices, namely, ss(0)~ss(3), occupy four bits at the end.

A space of 12 bits is available to the I4. Therefore, the coding space length available to the I4 is $2^{12}=4096$, which is enough because $WQ(4)=C_{16+4-1}^{4}=3876$.

EXAMPLE 3

N=3 pulses with signs are encoded. The structure of the coding index is as follows:

The coding index, Index(3), occupies 13 bits in total. That is, Index(3)∈[0, $2^{13}-1$].

Three sign indices, namely, ss(0)~ss(2), occupy three bits at the end.

A space of 10 bits is available to the I4. Therefore, the coding space length available to the I4 is $2^{10}=1024$, which is enough because $WQ(3)=C_{16+3-1}^{3}=816$.

A coding method is provided in the second embodiment. A method for calculating a distribution index I4 is provided in this embodiment, thus making it easy to determine the corresponding relation between I4 and the distribution of pulses on the track through algebraic calculation, where the distribution is Q(N)={q(0), q(1), . . . , q(N−1)}.

The following Q(N) sequencing calculation rule is provided in this embodiment.

The Q(N) varies with the value combination included in it. Therefore, serial numbers of the positions included in Q(N) may be permuted, supposing:

q(0)≦q(1)≦ . . . ≦q(N−1), or q(0)≧q(1)≧ . . . ≧q(N−1), where the equal means that the position of the pulse is repeatable. Supposing q(0)≦q(1)≦ . . . ≦q(N−1), q(0)∈[0, M], q(h)∈[q(h−1), M], where M is the total quantity of positions on the track. All possible values of Q(N) are ordered from a smaller value to a greater value or from a greater value to a smaller value after the values in each dimensions of the Q(N) are compared.

If they are ordered from a smaller value to a greater value and the ordered Q(N) are numbered, with the starting serial number being 0, then:

$$I4 = C_{PPT}^{N} - C_{PPT-q(0)}^{N} + \sum_{h=1}^{N-1}[C_{PPT-h-q(h-1)}^{N-h} - C_{PPT-h-q(h)}^{N-h}],$$

where C refers to calculating the combination function, and Σ refers to summing.

The foregoing formula may be interpreted as follows:

$C_{PPT}^{N}-C_{PPT-q(0)}^{N}$ refers to the total quantity of Q(N) when the first pulse is located before q(0);

$C_{PPT-1-q(0)}^{N-1}-C_{PPT-1-q(1)}^{N-1}$ refers to the total quantity of Q(N) when the first pulse is located at q(0) and the second pulse is located before q(1); and $C_{PPT-h-q(h-1)}^{N-h}-C_{PPT-h-q(h)}^{N-h}$ is interpreted by analogy.

It should be noted that the foregoing formula is only an exemplary calculation relation between I4 and Q(N). Depending on the same sequencing rule, the calculation relation may also be expressed in other algebraic modes equivalently. If a different sequencing rule is applied, similar calculation relations may also be designed. The mode of expressing the calculation relation does not constitute any limitation to the embodiments of the present invention.

To make the foregoing I4 calculation method clearer, a relative position vector of pulses is assumed: XX(N)={xx(1), xx(2), . . . , xx(N)}. The following one-to-one corresponding relation exists between XX(N) and Q(N):

xx(1)=q(0); and xx(i)=q(i−1)−q(i−2).

where xx(i) represents a relative position relation between the position of the ith pulse and the position of the (i−1)th pulse, and i∈[1, N]. The XX(N) can construct an N-layer tree that includes all possible values of Q(N). The depth of the tree is N+1, and the sub-node on the ith layer represents the relative position value xx(i) of the ith pulse. The values of xx(i) are arranged from left to right and from a smaller value to a greater value. The end nodes are encoded from left to right at the bottom (namely, end nodes) of the tree. Each path from an end node to a root node corresponds to a value of XX(N). Therefore, the code of each end node is the distribution index I4 indicative of the corresponding Q(N) value.

Given below is an example. Supposing M=16 and N=3 (M is the total quantity of positions on the track), the tree structure is shown in FIG. 3, and the formula for calculating the distribution index is:

$$I4(3)=C_{18}^{3}-C_{18-q(0)}^{3}+C_{17-q(0)}^{2}-C_{17-q(1)}^{2}+C_{16-q(1)}^{1}-C_{16-q(2)}^{1}.$$

If the value of N is different, the corresponding tree structure is similar, and the formula for calculating the I4 can be deduced and is not repeated here any further.

A method for obtaining a distribution index I4 through a calculation relation is disclosed in this embodiment. Because the data quantity occupied by the I4 in the coding index is large, the calculation method in this embodiment minimizes the storage load of the coder and the decoder. The I4 is encoded continuously in a strict one-to-one relation with Q(N), thus making the best of the coding bits and avoiding waste.

A coding method is disclosed in the third embodiment. The third embodiment differs from the first embodiment in that: The third embodiment regards the coding process in the first embodiment as a first coding mode, a coding mode is selected among options of the first coding mode first, and then pulses are encoded in the selected coding mode. As shown in FIG. 4, a coding process in this embodiment includes the following steps.

B1: The total quantity (N) of pulses to be encoded on the same track is determined.

The value of N generally depends on the coding rate.

B2: A coding mode is selected according to the value of N. Coding modes include a first coding mode. Depending on the selection result, the process proceeds to step B3 or step B4.

The coding mode described in the first embodiment is called a first coding mode in this embodiment. Optional coding modes include not only the first coding mode, but also other coding modes such as AMR_WB+ in the conventional art. A second coding mode, which is optional, is disclosed in this embodiment.

The coding mode may depend on the determined N value. For example, for some N values, the first coding mode is applied; and for other N values, the second coding mode is applied. Researches reveal that the first coding mode is preferred when the value of N is 3, 4, or 5.

B3: The result of selecting the coding mode is judged. If it is determined that the first coding mode is selected, the pulses are encoded in the first coding mode.

The specific coding process is similar to the description in the first embodiment, namely, steps A1, A2, and A3 in the first embodiment.

B4. The result of selecting the coding mode is judged. If it is determined that the second coding mode is selected, the pulses are encoded in the second coding mode. The second coding mode may include the following steps.

B41: Statistics about the positions of the pulses to be encoded on a track are collected to obtain the quantity of pulse positions, pulse distribution about how the position of each pulse is distributed on the track, and the quantity of pulses in each pulse position.

Similar to step A1 in the first embodiment, a pulse position vector, namely, $P(N)=\{p(0), p(1), \ldots, p(N-1)\}$, represents the distribution of the pulse positions on the track; a position sign vector, namely, $S(N)=\{s(0), s(1), \ldots, s(N-1)\}$, represents the pulse sign information of each pulse position; and the quantity of pulses on each pulse position is obtained. In this embodiment, a pulse quantity vector, namely, $SU(N)=\{su(0), su(1), \ldots, su(N-1)\}$, represents the quantity of pulses on each pulse position, where $su(n)$ represents the quantity of pulses in the $p(n)$ position. Evidently, $su(0)+su(1)+ \ldots +su(N-1)=N$.

Evidently, in this embodiment, a one-to-one corresponding relation exists between $P(N)$, $SU(N)$, and $S(N)$.

After the parameters such as N, $P(N)$, $SU(N)$, and $S(N)$ of the pulses to be encoded are obtained through statistics, the parameters need to be encoded into indices, and a corresponding relation is established between the parameter and the index so that the decoder can recover a parameter according to the corresponding index.

B42: The first index I1 is determined according to the quantity (namely, pos_num=N) of pulse positions. The first index I1 corresponds to all possible distributions of the pulse positions on the track when the pos_num is the same.

The pos_num value (N) fluctuates mildly. Therefore, the corresponding relation with the first index I1 may be expressed by either a calculation relation or a query relation. At the time of establishing a corresponding relation between pos_num and I1, this corresponding relation may be assumed as a one-to-one corresponding relation. Nevertheless, when the pos_num has other values, the index of other parameters requires fewer bits. Such pos_num values may use one I1 jointly, and are distinguished through an extra flag bit.

The pos_num value (N) decides the total quantity of all possible $P(N)$ values, and the total quantity is $W(N)=C_M^N$, where C refers to calculating the combination function. Therefore, one I1 corresponds to W(N) possible P(N), where W(N) is a natural number.

B43: The second index I2 is determined according to the distribution of the pulse positions on the track, where the distribution is expressed by $P(N)$. The second index I2 indicates the instance of distribution corresponding to the distribution of the current pulse position among all possible distributions corresponding to the first index I1.

The total quantity of all possible $P(N)$ values is $W(N)=C_M^N$. The W(N) is a large data quantity. Therefore, a calculation relation is preferred as a corresponding relation with the second index I2. Nevertheless, it is also practicable to express the corresponding relation through a query relation. Evidently, W(N) is the total quantity of all possible values of I2. If the value of I2 starts from 0, $I2\in[0, W(N)-1]$.

B44: The third index I3 is determined according to SU(N) which represents the quantity of pulses in each pulse position.

The SU(N) is a vector whose dimension is the same as the dimension of P(N), but is limited to $su(0)+su(1)+ \ldots +su(N-1)=N$, where the value of N generally ranges from 1 to 6.

Therefore, the corresponding relation with the third index I3 may be expressed by either a calculation relation or a query relation. Moreover, in view of the vector form, the query relation is preferred in the case of high dimensions, and the calculation relation is preferred in the case of low dimensions because it makes the design easier. It should be noted that in some extreme circumstances, for example, if N=1 or N=N, the SU(N) has only one possible value, which does not need to be indicated by a specific I3, and the I3 may be regarded as any value that does not affect the final coding index.

B45: A coding index, namely, Index(N), is generated. The Index(N) includes information about the first index I1, the second index I2, and the third index I3.

The I1, I2, and I3 may be placed into the coding index in any mode identifiable to the decoder, for example, by placing them into a fixed field separately, which is the simplest mode. When the total quantity (pulse_num) of pulses to be encoded on the same track is constant, the pos_num value (N) indicated by I1 decides the range of I2 and I3, namely, decides the quantity of coding bits required by I2 and I3. Therefore, the coding index is constructed in the following mode:

(1) The first index I1 is used as a start value, and the information about other indices is overlaid. A value of I1 corresponds to an independent value range of the coding index. In this way, the decoder can determine the pos_num value (N) directly according to the value range of the coding index.

(2) Further, in the value range of the I1 (generally corresponding to a certain field length), the I2 and the I3 may be placed in any mode identifiable to the decoder, for example, by placing them separately, which is the simplest mode. Generally, neither I2 nor I3 can be expressed as $2^n$ (n is an integer number). Therefore, in order to save coding bits, I2 and I3 may be combined in the following way and placed into the specified value range of I1:

$$I23=I3\times W(N)+I2=I3\times C_M^N+I2.$$

where the coding of both I2 and I3 starts from 0, I2 $[0, C_M^{N-1}]$, and $I3\in[0, Class(N)-1]$, where Class(N) is the total quantity of possible values of SU(N); evidently, such a mode is equivalent to dividing the value range of I1 into Class(N) portions, where the length of each portion is W(N), and each portion corresponds to a distribution, namely, a SU(N) value.

(3) Nevertheless, in the case that the pulse being encoded includes a sign, the Index(N) needs also to carry information about the sign index, namely, s(n), of each pulse. The position sign vector S(N) may be simply placed as a field with a length of N into a fixed position of the coding index, for example, at the end of the coding index.

To sum up, a mode of constructing the Index(N) may be:

$$Index(N)=I1+I23\times 2^N+s(0)\times 2^{N-1}+s(1)\times 2^{N-2}+ \ldots +s(N-1).$$

It is easily understandable that the mode of constructing a coding index described above is only an example of this embodiment. In practice, it is easy to derive other modes of constructing a coding index structure from the basic information about the coding index structure, for example, by swapping or recombining the index positions. The mode of constructing a coding index does not constitute any limitation to the embodiments of the present invention.

For any quantity of pulses to be encoded, the coding logics provided in the second coding mode may be applied uniformly, thus avoiding increase of the coding index redundancy of the recursive mode applied in AMR_WB+, and ensuring a high utilization ratio of the coding bits. Meanwhile, it is not necessary to encode multiple pulses in the same position separately. Instead, the positions of pulses are merged before coding, thus saving coding bits. With the increase of the pulses to be encoded on the track, the probability of overlaying pulse positions also increases, and the merits of the embodiments of the prevent invention are more noticeable.

Examples are given below in order to further facilitate the understanding of the mode of constructing a coding index in the second coding mode. Supposing that the total quantity of positions on the track is M=16 and the quantity of pulse positions is pos_num, and the pos_num is in a one-to-one corresponding relation with the first index I1:

EXAMPLE 1

N=6 pulses with signs are encoded. FIG. 5 shows the structure of the coding index.

The coding index, namely, Index(6), occupies 21 bits in total. That is, Index(6)$\in$[0, $2^{21}$−1]. FIG. 5 shows the quantity of bits occupied by different portions of Index(6) when the pos_num value varies. To put it more clearly, I1(N), I2(N), I3(N), and I23(N) are used to represent the foregoing index when N is a specific value. The I1(N) is determined in a mapping mode:

I1(1)=0x1F0000, I1(2)=0x1E0000, I1(3)=0x1D0000,
I1(4)=0x180000, I1(5)=0x000000, I1(6)=0x100000.
FIG. 5 is described below.

(1) When six pulses are in one position, N=1, W(1)=16, I2(1)$\in$[0, 15], SU(1)={6}, Class(1)=1, and I3(1)=0,
  and therefore, I23(1)=I2(1)$\in$[0, 15];
  one sign index, namely, s(0), occupies one bit at the end; and
  the coding space length provided by I1(1) for I23(1) is [$2^{21}$−I1(1)]/$2^1$=32768, which is obviously enough.

(2) When six pulses are in two positions, N=2, W(2)=120, I2(2)$\in$[0, 119], SU(2)={5, 1}, {4, 2}, {3, 3}, {2, 4}, {1, 5}; Class(2)=5, and I3(2)$\in$[0, 4],
  and therefore, I23(2)=I3(2)×120+I2(2)$\in$[0, 599];
  two sign indices, namely, s(0) and s(1), occupy two bits at the end; and
  the coding space length provided by I2(2) for I23(2) is [I1(1)−I1(2)]/22=16384, which is obviously enough.

(3) When six pulses are in three positions, N=3 W(3)=560, I2(3)$\in$[0, 559], SU(3)={4, 1, 1}, {1, 4, 1}, {1, 1, 4}, {3, 2, 1}, {3, 1, 2}, {2, 3, 1}, {2, 1, 3}, {1, 3, 2}, {1, 2, 3}, {2, 2, 2}; Class(3)=10, and I3(3)$\in$[0, 9],
  and therefore, I23(3)=I3(3)×560+I2(3)$\in$[0, 5599];
  three sign indices, namely, s(0)-s(2), occupy three bits at the end; and
  the coding space length provided by I2(3) for I23(3) is [I1(2)−I1(3)]/$2^3$=8192, which is obviously enough.

(4) When six pulses are in four positions, N=4, W(4)=1820, I2(4)$\in$[0, 1819], SU(4)={3, 1, 1, 1}, {1, 3, 1, 1}, {1, 1, 3, 1}, {1, 1, 1, 3}, {2, 2, 1, 1}, {2, 1, 2, 1}, {2, 1, 1, 2}, {1, 2, 2, 1}, {1, 2, 1, 2}, {1, 1, 2, 2}; Class(4)=10, and I3(4)$\in$[0, 9],
  and therefore, I23(4)=I3(4)×1820+I2(4)$\in$[0, 18199];
  four sign indices, namely, s(0)-s(3), occupy four bits at the end; and
  the coding space length provided by I2(4) for I23(4) is [I1(3)−I1(4)]/24=20480, which is obviously enough.

(5) When six pulses are in five positions, N=5, W(5)=4368, I2(5)$\in$[0, 4367], SU(5)={2, 1, 1, 1, 1}, {1, 2, 1, 1, 1}, {1, 1, 2, 1, 1}, {1, 1, 1, 2, 1}, {1, 1, 1, 1, 2}; Class(5)=5, and I3(5)$\in$[0, 4],
  and therefore, I23(5)=I3(5)×4368+I2(5)$\in$[0, 21839];
  five sign indices, namely, s(0)-s(4), occupy five bits at the end; and
  the coding space length provided by I2(5) for I23(5) is [I1(6)−I1(5)]/25=32768, which is obviously enough.

(6) When six pulses are in six positions, N=6, W(6)=8008, I2(6)$\in$[0, 8007], SU(6)={1, 1, 1, 1, 1, 1}, Class(6)=1, and I3(6)=0,
  and therefore, I23(6)=I2(6)$\in$[0, 8007];
  six sign indices, namely, s(0)-s(5), occupy six bits at the end; and
  the coding space length provided by I2(6) for I23(6) is [I1(4)−I1(6)]/26=8192, which is obviously enough.

EXAMPLE 2

N=5 pulses with signs are encoded. FIG. 6 shows the structure of the coding index.

The coding index, Index(5), occupies 19 bits in total. That is, Index(5)$\in$[0, $2^{19}$−1]. FIG. 6 shows the quantity of bits occupied by different portions of Index(5) when the pos_num value varies. The I1(N) is determined in a mapping mode:

I1(1)=0x78000, I1(2)=0x70000, I1(3)=0x60000,
I1(4)=0x40000, I1(5)=0x00000.

The detailed analysis on FIG. 6 is similar to that on FIG. 5, and is not repeated here any further.

EXAMPLE 3

N=4 pulses with signs are encoded.

The coding index, Index(4), occupies 16 bits in total. That is, Index(4)$\in$[0, $2^{16}$−1]. The figure shows the quantity of bits occupied by different portions of Index(4) when the pos_num value varies. The I1(N) is determined in a mapping mode:

I1(1)=0xE000, I1(2)=0xC000, I1(3)=0x8000, I1(4)=0x0000.

EXAMPLE 4

N=3 pulses with signs are encoded.

The coding index, Index(3), occupies 13 bits in total. That is, Index(3)$\in$[0, $2^{13}$−1]. The figure shows the quantity of bits occupied by different portions of Index(3) when the pos_num value varies. The I1(N) is determined in a mapping mode:

I1(1)=0x1C00, I1(2)=0x1800, I1(3)=0x0000.

EXAMPLE 5

N=2 pulses with signs are encoded.

The coding index, Index(2), occupies 9 bits in total. That is, Index(2)$\in$[0, $2^9$−1]. The figure shows the quantity of bits occupied by different portions of Index(2) when the pos_num value varies. The I1(N) is determined in a mapping mode:

I1(1)=0x1E0, I1(2)=0x000.

EXAMPLE 6

N=1 pulse with a sign is encoded.

The coding index, Index(1), occupies 5 bits in total. That is, Index(1)$\in$[0, $2^5$−1]. Considering N≡1, the Index(1) includes only index I23(1)=I2(1) and s(0) which is a sign index of p(0).

A coding method is disclosed in the fourth embodiment. More specifically, a method for calculating the second index I2 in the second coding mode is provided in this embodiment, thus making it easy to determine the corresponding relation between I2 and the distribution of the pulse positions on a track through algebraic calculation, where the distribution is P(N)={p(0), p(1), . . . , p(N−1)}.

In this embodiment, the method of calculating I2 is: All possible P(N) values are permuted in a set order, where N is the quantity of pulse positions corresponding to the first index I1; the permuting number in the permutation serves as a second index I2 indicative of the distribution.

The "set order" may be understood as an order of all possible P(N) values determined by the coder and the decoder according to the same sequencing calculation rule. The following sequencing calculation rule is provided in this embodiment:

The P(N) varies with the value combination included in it. Therefore, serial numbers of the positions included in P(N) may be permuted, supposing:

p(0)<p(1)< . . . <p(N−1), or p(0)>p(1)> . . . >p(N−1).

Supposing p(0)<p(1)< . . . <p(N−1), p(0)∈[0, M−N], p(n)∈[p(n−1)+1, M−N+n], where M is the total quantity of positions on the track. All possible values of P(N) are ordered from a smaller value to a greater value or from a greater value to a smaller value after the values in each dimensions of the P(N) are compared.

If they are ordered from a smaller value to a greater value and the ordered P(N) values are numbered, with the starting serial number being 0, then:

$$I2 = C_M^N - C_{M-p(0)}^N + \sum_{n=1}^{N-1} [C_{M-p(n-1)-1}^{N-n} - C_{M-p(n)}^{N-n}],$$

where C refers to calculating the combination function, and Σ refers to summing.

The foregoing formula may be interpreted as follows:

$C_M^N - C_{M-p(0)}^N$ refers to the total quantity of P(N) when the first pulse is located before p(0);

$C_{M-p(0)-1}^{N-1} - C_{M-p(1)}^{N-1}$ refers to the total quantity of P(N) when the first pulse is located at p(0) and the second pulse is located before p(1); and $C_{M-p(n-1)}^{N-n} - C_{M-p(n)}^{N-n}$ is interpreted by analogy.

It should be noted that the foregoing formula is only an exemplary calculation relating I4 to Q(N). Depending on the same sequencing rule, the calculation relation may also be expressed in other algebraic modes equivalently. If a different sequencing rule is applied, similar calculation relations may also be designed. The mode of expressing the calculation relation does not constitute any limitation to the embodiments of the present invention.

To make the foregoing I2 calculation method clearer, a relative position vector of pulses is assumed: X(N)={x(1), x(2), . . . , x(N)}. The following one-to-one corresponding relation exists between X(N) and P(N):

$x(1)=p(0)$; and $x(i)=p(i-1)-p(i-2)$.

where x(i) represents a relative position relation between the ith pulse position and the (i−1)th pulse position, i∈[1, N]. The X(N) can construct an N-layer tree that includes all possible values of P(N). The depth of the tree is N+1, and the sub-node on the ith layer represents the relative position value x(i) of ith position with pulse. The values of x(i) are arranged from left to right and from a smaller value to a greater value. The end nodes are encoded from left to right at the bottom (namely, end nodes) of the tree. Each path from an end node to a root node corresponds to a value of X(N). Therefore, the code of each end node is the second index I2 indicative of the corresponding P(N) value.

In the examples given below, it is assumed that the total quantity of positions on the track is M=16.

EXAMPLE 1

Figure 7:
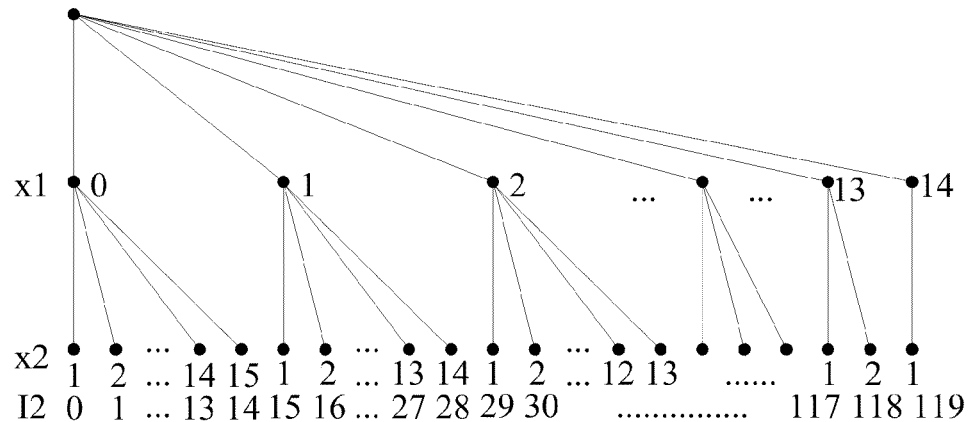
FIG. 7 shows a structure of an X(N) tree in the case of N=2 according to a fourth embodiment of the present invention.

The quantity of pulse positions, namely, pos_num, is N=2, and FIG. 7 shows the tree structure.

$$I2(2) = C_{16}^2 - C_{16-x(1)}^2 + C_{16-x(1)-1}^1 - C_{16-[x(1)+x(2)]}^1$$
$$= C_{16}^2 - C_{16-p(0)}^2 + C_{16-p(0)-1}^1 - C_{16-p(1)}^1$$

EXAMPLE 2

Figure 8:
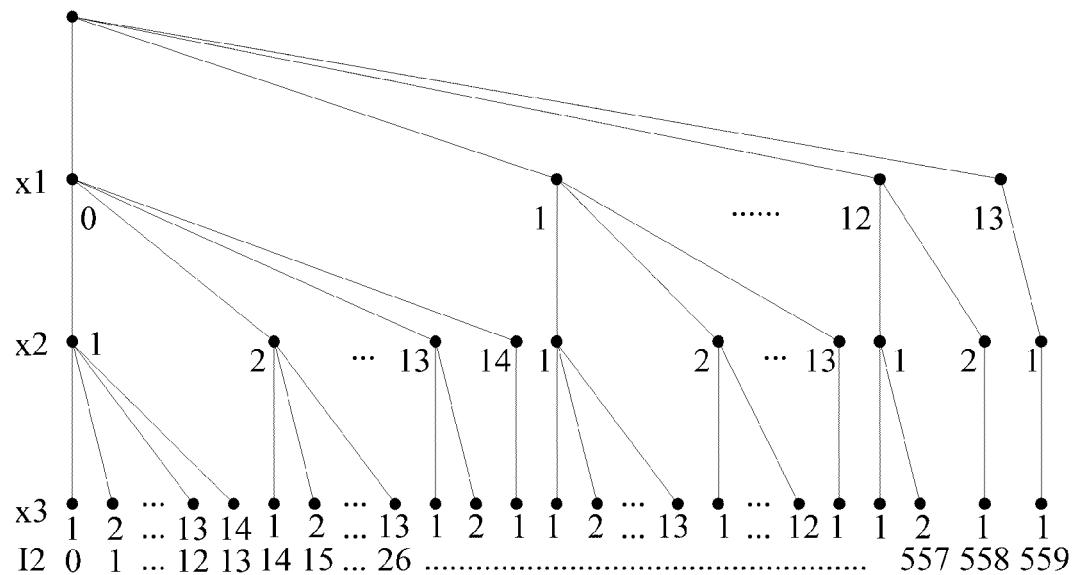
FIG. 8 shows a structure of an X(N) tree in the case of N=3 according to the fourth embodiment of the present invention.

The quantity of pulse positions, namely, pos_num, is N=3, and FIG. 8 shows the tree structure.

$$I2(3) = C_{16}^3 - C_{16-x(1)}^3 + C_{16-x(1)-1}^2 - C_{16-[x(1)+x(2)]}^2 + C_{16-[x(1)+x(2)]-1}^1 -$$
$$C_{16-[x(1)+x(2)+x(3)]}^1$$
$$= C_{16}^3 - C_{16-p(0)}^3 + C_{16-p(0)-1}^2 - C_{16-p(1)}^2 + C_{16-p(1)-1}^1 - C_{16-p(2)}^1$$

When the value of N is 4, 5, or 6, the corresponding tree structure is similar, and the formula for calculating the I2 can be deduced and is not repeated here any further.

A method for obtaining a second index I2 through a calculation relation is disclosed in this embodiment. Because the data quantity occupied by the I2 in the coding index is large, the calculation method in this embodiment minimizes the storage load of the coder and the decoder. The I2 is encoded continuously in a strict one-to-one relation with P(N), thus making the best of the coding bits and avoiding waste.

The merits of the coding index construction mode in the first coding mode and the second coding mode are given below. In theory, on the precondition that the total quantity (pulse_num) of the pulses to be encoded on the same track is constant, the quantity of all possible permutations of all pulses on the track is the minimum value range of the coding index, and the corresponding quantity of coding bits is a theoretic lower limit. When the quantity of permutations is $2^n$ (n is an integer), the theoretic lower limit of the quantity of coding bits is an integer; when the quantity of permutations is not $2^n$ (n is an integer), the theoretic lower limit of the quantity of coding bits is a decimal fraction. In this case, certain coding redundancy exists. When the total quantity of positions on the track is M=16, with different values of pulse_num, a comparison is made between the theoretic lower limit of the quantity of coding bits, and the quantity of coding bits required in the AMR_WB+ coding mode, and the quantity of bits required by the coding index construction mode in the first coding mode and the second coding mode, as shown in Table 1:

TABLE 1

| | | Required bits | | | |
|---|---|---|---|---|---|
| N | Total permutations | Theoretic lower limit | AMR_WB+ | First coding mode | Second coding mode |
| 1 | 32 | 5 | 5 | 5 | 5 |
| 2 | 512 | 9 | 9 | 10 | 9 |

TABLE 1-continued

| | | Required bits | | | |
|---|---|---|---|---|---|
| N | Total permutations | Theoretic lower limit | AMR_WB+ | First coding mode | Second coding mode |
| 3 | 5472 | 12.4179 | 13 | 13 | 13 |
| 4 | 44032 | 15.4263 | 16 | 16 | 16 |
| 5 | 285088 | 18.1210 | 20 | 19 | 19 |
| 6 | 1549824 | 20.5637 | 22 | 22 | 21 |

Table 1 reveals that: The coding index construction mode of the second coding mode reaches the theoretic lower limit when the theoretic lower limit is an integer, and reaches 1 plus the integer part of the theoretic lower limit when the theoretic lower limit is a decimal fraction. When N is 3, 4, or 5, the first coding mode has a coding bit length equal to that of the second coding mode. In the case of high code rates, both of such coding modes provide a coding efficiency higher than that of the AMR_WB+, namely, can save more bits.

With respect to calculation complexity, by using all the test orders in the reference codes of the AVS-M mobile audio standard as test objects, a comparison of operation time is made between the AMR_WB+, the first coding mode, and the second coding mode (all sample spaces are traversed, including the coding process and the decoding process, the first coding mode is the calculation mode provided in the second embodiment, the second coding mode is the calculation mode provided in the fourth embodiment, and the decoding mode is the corresponding mode provided in the subsequent embodiments), as shown in Table 2:

TABLE 2

| | Operation time (computer clock period) | | |
|---|---|---|---|
| N | AMR_WB+ | First coding mode | Second coding mode |
| 1 | 134 | 38.78 | 5 |
| 2 | 168 | 155.9 | 9 |
| 3 | 274 | 278.3 | 13 |
| 4 | 480 | 356.5 | 16 |
| 5 | 633 | 475.6 | 19 |
| 6 | 1080 | 22 | 21 |

Table 2 reveals that: The first coding mode involves lower operation complexity in most circumstances, and the operation complexity of the second coding mode is equivalent to that of the AMR_WB+. Table 1 and Table 2 reveal that: By using the first coding mode and the second coding mode, the low calculation complexity of the first coding mode is exerted when N is 3, 4, or 5, and the low coding bit length of the second coding mode is exerted when N is another value.

Figure 9:
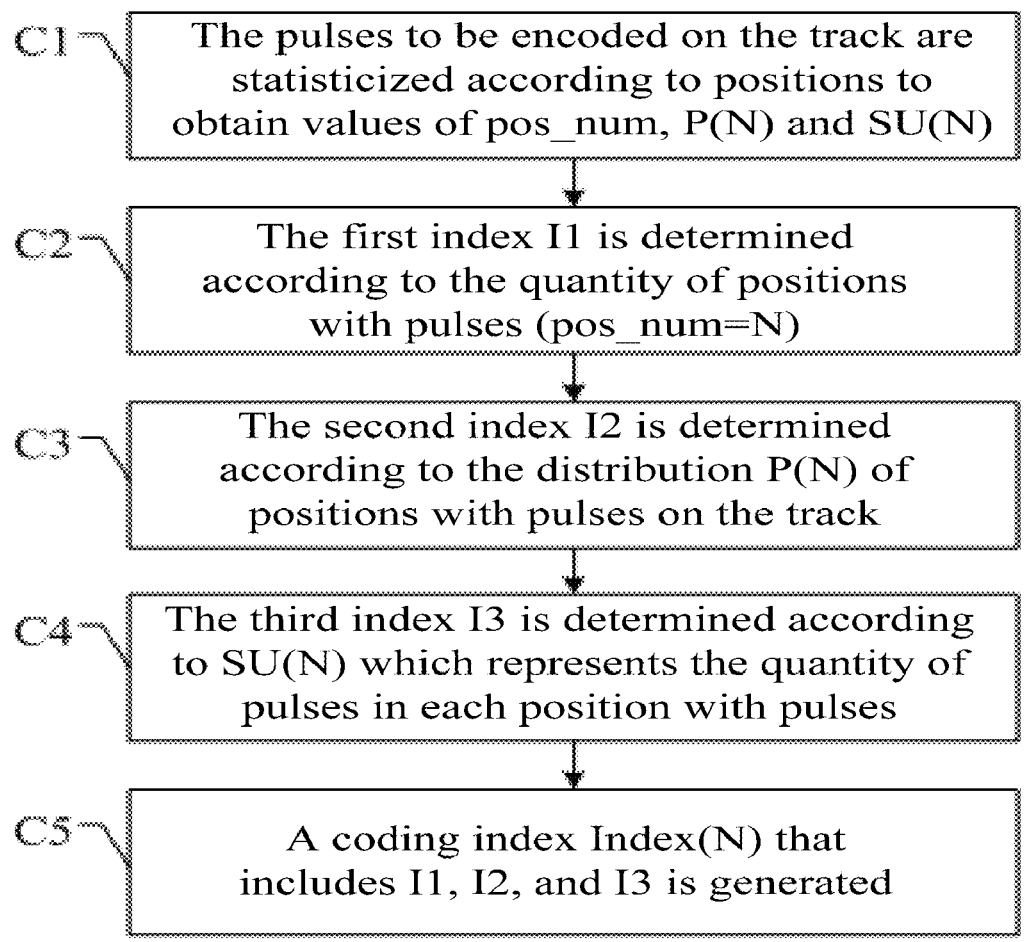
FIG. 9 is a flowchart of a coding method according to a fifth embodiment of the present invention.

A coding method is disclosed in the fifth embodiment of the present invention. As shown in FIG. 9, the coding method includes the following steps:

C1: Statistics about the pulses to be encoded on a track are collected according to positions, to obtain the quantity of pulse positions, pulse distribution about how the position of each pulse is distributed on the track, and the quantity of pulses in each pulse position.

The description about step C1 is similar to the description about step B41 in the third embodiment, and is not repeated here any further.

C2: The first index I1 is determined according to the quantity (namely, pos_num=N) of pulse positions. The first index I1 corresponds to all possible distributions of the pulse positions on the track when the pos_num is the same.

The description about step C2 is similar to the description about step B42 in the third embodiment, and is not repeated here any further.

C3: The second index I2 is determined according to the distribution of the pulse positions on the track, where the distribution is expressed by P(N). The second index I2 indicates the instance of distribution corresponding to the distribution of the current pulse position among all possible distributions corresponding to the first index I1.

The description about step C3 is similar to the description about step B43 in the third embodiment, and is not repeated here any further.

C4: The third index I3 is determined according to SU(N) which represents the quantity of pulses in each pulse position.

The description about step C4 is similar to the description about step B44 in the third embodiment, and is not repeated here any further.

C5: A coding index, namely, Index(N), is generated. The Index(N) includes information about the first index I1, the second index I2, and the third index I3.

The description about step C5 is similar to the description about step B45 in the third embodiment, and is not repeated here any further.

The relevant description about the fifth embodiment is similar to the description about the third embodiment (including the examples), and is not repeated here any further.

A coding method is disclosed in the sixth embodiment. In this embodiment, the coding logics identical to those of the fifth embodiment are applied. Specifically, a method for calculating the second index I2 is provided in this embodiment, thus making it easy to determine the corresponding relation between I2 and the distribution of the pulse positions on a track through algebraic calculation, where the distribution is P(N)={p(0), p(1), . . . , p(N−1)}. The detailed description is similar to that of the fourth embodiment, and is not repeated here any further.

The decoding method disclosed herein is detailed below.

Figure 10:
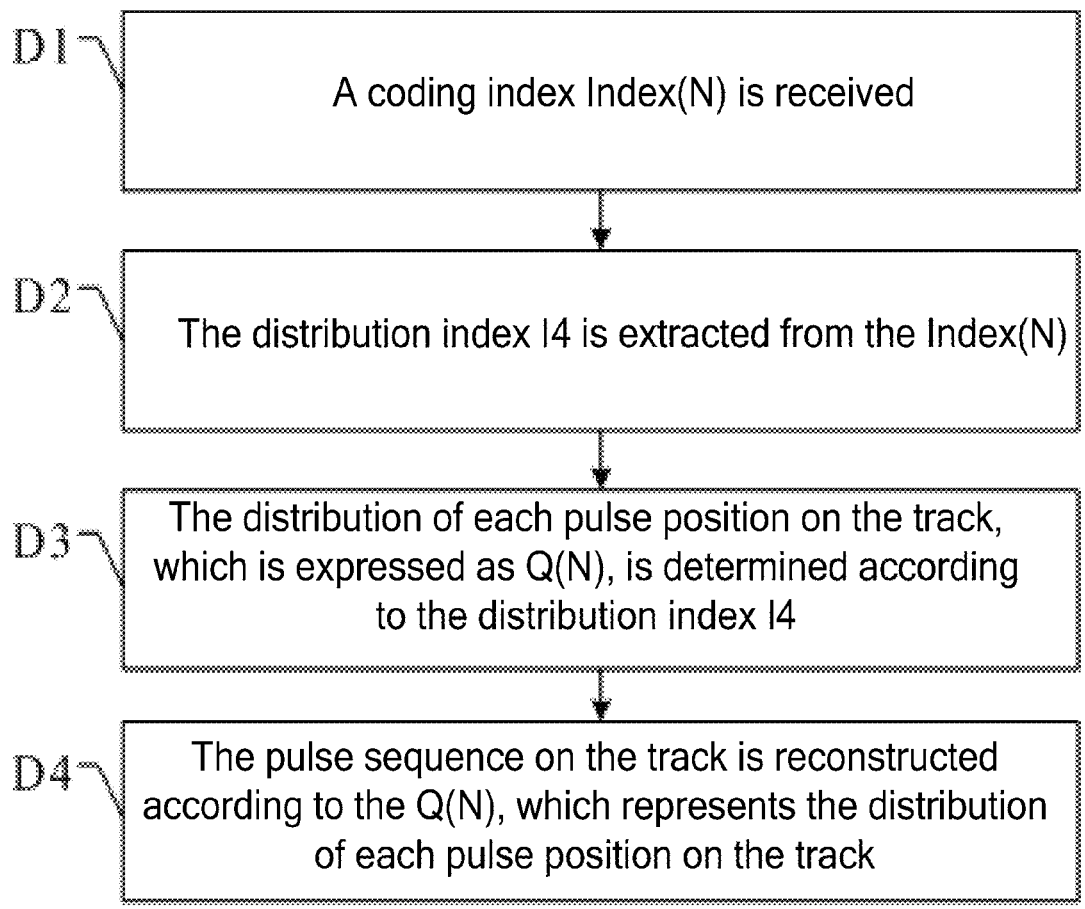
FIG. 10 is a flowchart of a decoding method according to a seventh embodiment of the present invention.

A decoding method is provided in the seventh embodiment. The decoding method provided in this embodiment decodes the coding index obtained according to the coding method in the first embodiment. The decoding process is the inverse of the coding process. As shown in FIG. 10, the decoding process includes the following steps:

D1: A coding index Index(N) is received.

D2: The distribution index I4 is extracted from the Index (N).

The process of extracting the distribution index I4 from the Index(N) may be the inverse of the process of placing the I4 into the Index(N) at the time of coding. For example, if the I4 is placed into a fixed field, the I4 may be extracted from the field directly.

If the coded pulse is a pulse with a sign, the sign index ss(h) corresponding to each pulse needs to be extracted from the Index(N). The total quantity of bits varies with the code rate. Therefore, the decoder may determine the total quantity of pulses encoded on the same track, namely, pulse_num=N, directly according to the length (quantity of bits) of the coding index, and then extract the corresponding quantity of sign indices ss(h) from the Index(N) according to N. According to the structure of the Index(N) provided in the first embodiment, the N sign indices are located at the end of the Index(N), and therefore, each ss(h) may be extracted from the Index(N) directly.

D3: The distribution of each pulse position on the track, which is expressed as Q(N), is determined according to the distribution index I4.

The decoding of the I4 is the inverse of encoding the I4. If the I4 is obtained through a calculation relation in the coding process, the same calculation relation may be applied in the decoding process to perform an inverse operation; if the I4 is obtained through a query relation in the coding process, the same corresponding relation may be queried in the decoding process.

D4: The pulse order on the track is reconstructed according to the Q(N), which represents the distribution of each pulse position on the track.

If the pulse includes a sign, at the time of reconstructing the pulse order on the track, the positive or negative feature of the pulse sign of each pulse needs to be recovered according to the pulse sign information carried in each sign index ss(h).

A decoding method is disclosed in the eighth embodiment. The decoding logics applied in this embodiment are the same as those applied in the seventh embodiment. The eighth embodiment discloses a calculation method for decoding the distribution index I4 obtained through the coding method in the second embodiment. This calculation method at the decoder is the inverse of the method for calculating the I4 in the second embodiment.

If the I4 is obtained through $$I4 = C_{PPT}^N - C_{PPT-q(0)}^N + \sum_{h=1}^{N-1}[C_{PPT-h-q(h-1)}^{N-h} - C_{PPT-h-q(h)}^{N-h}]$$

in the coding process, the following calculation process is applied at the decoder:

(1) $T[q(0)] = I4 - (C_{PPT}^N - C_{PPT-q(0)}^N)$ is calculated from a smaller q(0) value to a greater q(0) value, where: q(0)∈[0, M], M is the total quantity of positions on the track, N is the total quantity of pulses encoded on the same track, PPT=M+N−1, and C refers to calculating the combination function. The last q(0) value that lets T[q(0)] be greater than zero is recorded as the position v0 of the first pulse on the track.

(2) If N>1, $T1[q(1)] = T(v0) - (C_{PPT-1-v0}^{N-1} - C_{PPT-1-q(1)}^{N-1})$ is further calculated from a smaller q(1) value to a greater q(1) value, where q(1)∈[v0, M]; and the last q(1) value that lets T1[q(1)] be greater than zero is recorded as the position v1 of the second pulse on the track.

(3) By analogy, $Th[q(h)] = T(h-1)[q(h-1)] - (C_{PPT-h-v(h-1)}^{N-h} - C_{PPT-h-q(h)}^{N-h})$ is calculated from a smaller q(h) value to a greater q(h) value, where: q(h)∈[v(h−1), M], and h∈[2, N−1]; and the last q(h) value that lets Th[q(h)] be greater than zero is recorded as the position vh for the $(h+1)^{th}$ pulse(h+1 is an ordinal number) on the track.

(4) The decoding of the I4 is completed, and Q(N)={q(0), q(1), . . . , q(N−1)} is obtained.

Figure 11:
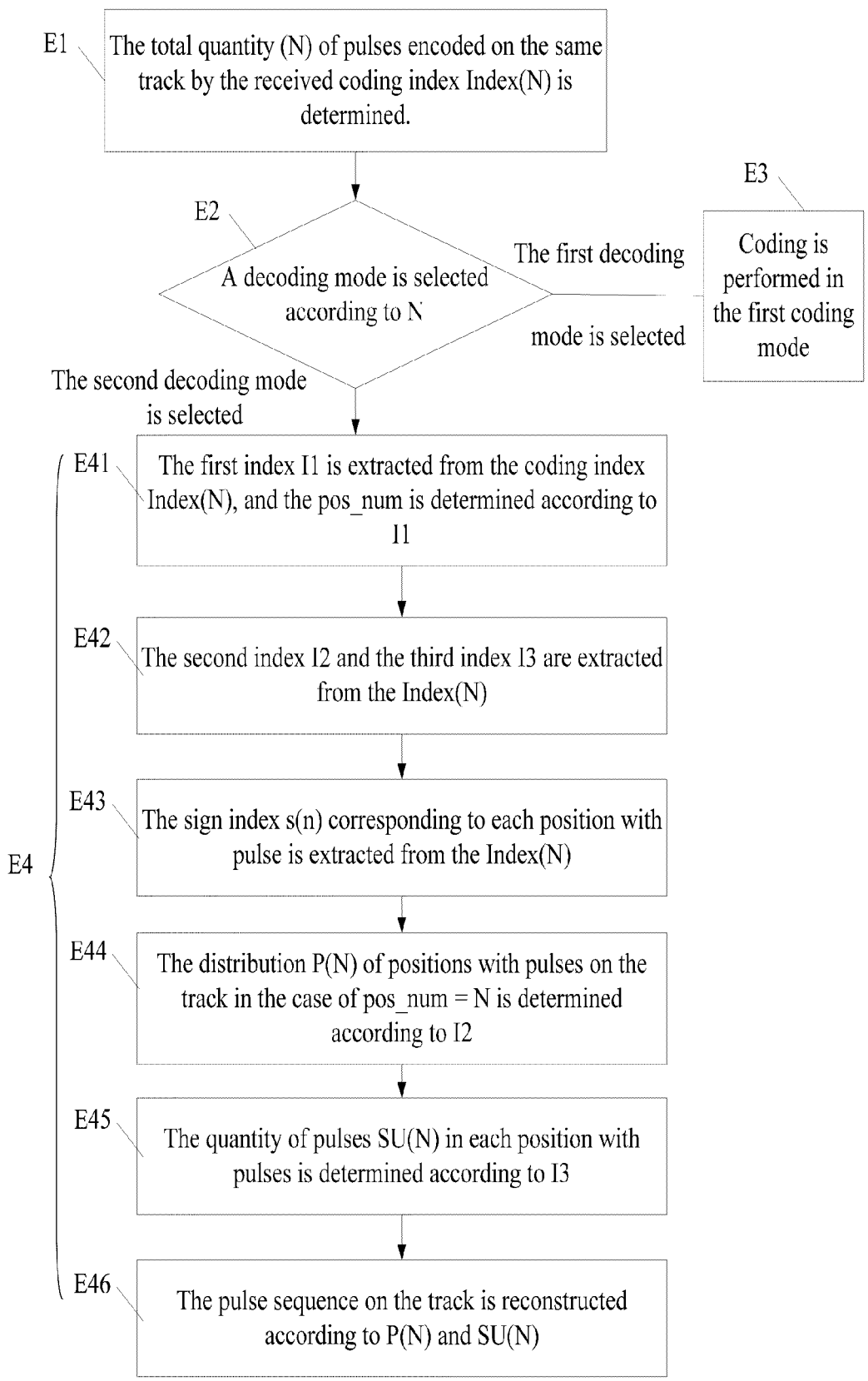
FIG. 11 is a flowchart of a decoding method according to a ninth embodiment of the present invention.

A decoding method is provided in the ninth embodiment. The decoding method provided in this embodiment decodes the coding index obtained according to the coding method in the third embodiment. The decoding process is the inverse of the coding process. As shown in FIG. 11, the decoding process includes the following steps:

E1: The total quantity (N) of pulses encoded on the same track by the received coding index Index(N) is determined.

The decoder may determine the total quantity of pulses encoded on the same track, namely, pulse_num=N, directly according to the length (quantity of bits) of the coding index. Nevertheless, the decoder may also obtain the N value corresponding to the coding index in a mode agreed with the encoder (for example, by exchanging information mutually before receiving the coding index). This embodiment does not specify the mode of obtaining the N.

E2: A decoding mode is selected according to the value of N. Decoding modes include a first decoding mode. Depending on the selection result, the process proceeds to step E3 or step E4.

The decoding mode described in the seventh embodiment is called a first decoding mode in this embodiment. Optional decoding modes include not only the first decoding mode, but also other decoding modes. Each optional decoding mode needs to correspond to the coding mode provided at the encoder. This embodiment provides a second decoding mode corresponding to the second coding mode described above.

In order to ensure consistency between the coding mode and the decoding mode, the decoder needs to select a decoding mode by using the corresponding rule applied at the coder.

E3: The result of selecting the decoding mode is analyzed. If it is determined that the first decoding mode is selected, the pulses are decoded in the first coding mode. The step of extracting the distribution index from the coding index is performed.

For the specific decoding process, the description in the seventh embodiment serves as a reference.

E4: The result of selecting the decoding mode is analyzed. If it is determined that the second decoding mode is selected, the pulses are decoded in the second decoding mode. The second decoding mode may include the following steps:

E41: The first index I1 is extracted from the Index(N). The quantity of pulse positions, namely, pos_num, is determined according to the I1.

The total quantity of bits varies with the code rate. Therefore, the decoder may determine the total quantity of pulses encoded on the same track, namely, pulse_num=N, directly according to the length (quantity of bits) of the coding index.

The process of extracting the information about each index from the Index(N) may be the inverse of the process of combining the indices into an Index(N) at the coder. For example, if each index is placed into a fixed field separately, the index may be extracted from the field directly.

If the Index(N) is a structure that uses the I1 as a starting value and overlays other indices as described in the third embodiment, it is appropriate to extract the I1 first, and then determine the positions of other indices in the Index(N) according to the pos_num value (N) corresponding to the I1. In this case, considering that one I1 corresponds to an independent value range of the Index(N), the decoder may judge the value range of the Index(N) among several set independent value ranges, and determine the first index I1 according to the starting value of such a value range.

E42: The second index I2 and the third index I3 are extracted from the Index(N).

Like I1, the I2 and the I3 are also extracted in a process contrary to the process of combining the I2 and the I3 into the Index(N), and can be extracted directly if they are placed independently at the coder. If the I2 and the I3 are combined and overlaid in the coding process as described in the third embodiment, they can be separated in the following steps:

(1) The combination value of I2 and I3, namely, I23, is extracted from the Index(N).

The position of I23 in the Index(N) may be indicated by the N value determined by the I1.

(2) The I2 and the I3 are separated in this way: I2=I23% W(N) and I3=Int[I23/W(N)].

W(N) is the total quantity of all possible P(N) in the case of pos_num=N, and W(N)=$C_M^N$, where M is the total quantity of positions on the track, % refers to taking the remainder and Int refers to taking the integer.

E43: If the coded pulse is a pulse with a sign, the sign index s(n) corresponding to each pulse position needs to be extracted from the Index(N).

According to the structure of the Index(N) provided in the third embodiment, the N sign indices are located at the end of the Index(N). Therefore, each s(n) may be separated from the Index(N) directly after the N value indicated by the I1 is obtained.

E44: The distribution of each pulse position on the track in the case of pos_num=N is determined according to the second index I2, where the distribution is expressed as P(N).

The decoding of the I2 is the inverse of encoding the I2. If the I2 is obtained through a calculation relation in the coding process, the same calculation relation may be applied in the decoding process to perform an inverse operation. If the I2 is obtained through a query relation in the coding process, the same corresponding relation may be queried in the decoding process.

E45: The SU(N), which represents the quantity of pulses in each pulse position, is determined according to the third index I3. The rule of decoding the I3 is similar to the rule of decoding the I2.

E46: The pulse order on the track is reconstructed according to the P(N) and the SU(N), where: P(N) represents distribution of pulse positions on the track, and SU(N) represents the quantity of pulses in each pulse position.

If the pulse includes a sign, at the time of reconstructing the pulse order on the track, the positive or negative feature of the pulse sign of each pulse position needs to be recovered according to the pulse sign information carried in each sign index s(n).

A decoding method is disclosed in the tenth embodiment. The decoding logics applied in this embodiment are the same as those applied in the ninth embodiment. The tenth embodiment discloses a calculation method in the second decoding mode for decoding the second index I2 obtained through the coding method in the fourth embodiment. This calculation method at the decoder is the inverse of the method for calculating the I2 in the fourth embodiment.

If the I2 is obtained through $$I2 = C_M^N - C_{M-p(0)}^N + \sum_{n=1}^{N-1}[C_{M-p(n-1)-1}^{N-n} - C_{M-p(n)}^{N-n}]$$

in the coding process, the following calculation process is applied at the decoder:

(1) $C_{M-1}^{N-1}, \ldots,$ and $C_{M-y0}^{N-1}$ are subtracted from I2 one by one.

$$R(y0)=I2-C_{M-1}^{N-1}-\ldots-C_{M-y0}^{N-1},$$

until the I2 remainder R(y0) changes from a positive number to a negative number, where M is the total quantity of positions on the track, N is the quantity of pulse positions, y0∈[1, M−N+1], and C refers to calculating the combination function. The p(0), namely, the serial number of the first pulse position on the track, is recorded, where p(0)=y0−1.

(2) If N>1, $C_{M-p(0)-1}^{N-2}, \ldots,$ and $C_{M-p(0)-y1}^{N-2}$ are further subtracted from R[p(0)] one by one until the R[p(0)] remainder R1(x1) changes from a positive number to a negative number. The p(1), namely, the serial number of the second pulse position on the track, is recorded, where p(1)=y1−1.

(3) By analogy, $C_{M-p(0)-\ldots-p(n-1)-1}^{N-n-2}, \ldots,$ and $C_{M-p(0)-\ldots-p(n-1)-yn}^{N-n-2}$ are further subtracted from R(n−1)[p(n−1)] one by one until the R(n−1)[p(n−1)] remainder Rn(yn) changes from a positive number to a negative number, where n≦N−1. The p(n), namely, the serial number of the n+1 pulse position on the track, is recorded, where p(n)=yn−1.

(4) The decoding of the I2 is completed, and P(N)={p(0), p(1), . . . , p(N−1)} is obtained.

Figure 12:
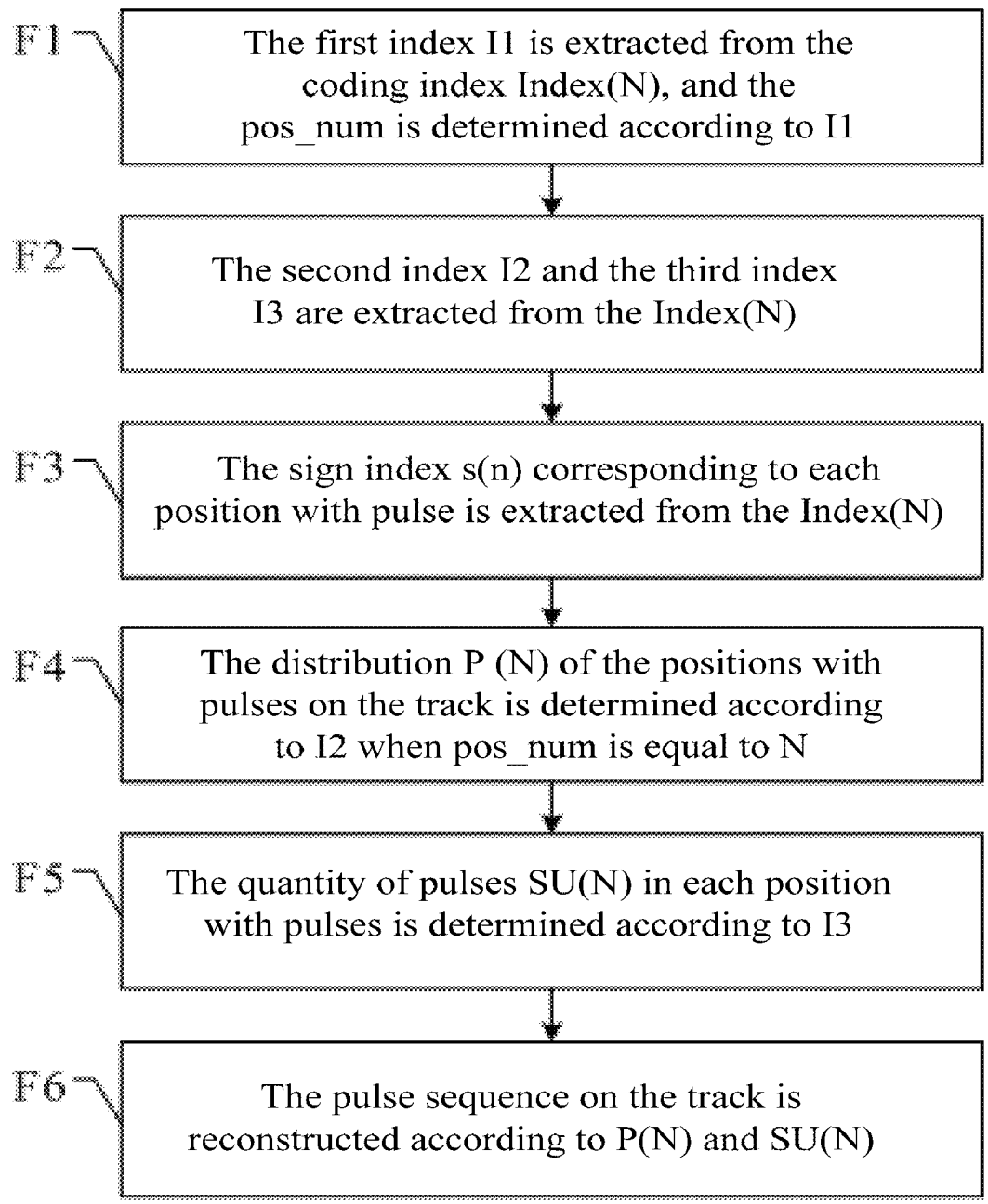
FIG. 12 is a flowchart of a decoding method according to an eleventh embodiment of the present invention.

A decoding method is provided in the eleventh embodiment. The decoding method provided in this embodiment decodes the coding index obtained according to the coding method in the fifth embodiment. The decoding process is the inverse of the coding process. As shown in FIG. 12, the decoding process includes the following steps:

F1: The coding index Index(N) is received, and the first index I1 is extracted from the Index(N). The quantity of pulse positions, namely, pos_num, is determined according to the I1.

The description about step F1 is similar to that of step E41 in the ninth embodiment.

F2: The second index I2 and the third index I3 are extracted from the Index(N).

The description about step F2 is similar to that of step E42 in the ninth embodiment.

F3: If the coded pulse is a pulse with a sign, the sign index s(n) corresponding to each pulse position needs to be extracted from the Index(N).

The description about step F3 is similar to that of step E43 in the ninth embodiment.

F4: The distribution of each pulse position on the track in the case of pos_num=N is determined according to the second index I2, where the distribution is expressed as P(N).

The description about step F4 is similar to that of step E44 in the ninth embodiment.

F5: The SU(N), which represents the quantity of pulses in each pulse position, is determined according to the third index I3. The rule of decoding the I3 is similar to the rule of decoding the I2. The description about step F5 is similar to that of step E45 in the ninth embodiment.

F6: The pulse order on the track is reconstructed according to the P(N) and the SU(N), where P(N) represents the distribution of each pulse position on the track, and SU(N) represents the quantity of pulses in each pulse position.

The description about step F6 is similar to that of step E46 in the ninth embodiment.

A decoding method is disclosed in the twelfth embodiment. The decoding logics applied in this embodiment are the same as those applied in the eleventh embodiment. The eighth embodiment discloses a calculation method for decoding the second index I2 obtained through the coding method in the sixth embodiment. This calculation method at the decoder is the inverse of the method for calculating the I2 in the sixth embodiment. The detailed description is similar to that of the fourth embodiment, and is not repeated here any further.

It is understandable to those skilled in the art that all or part of the steps of the foregoing embodiments may be implemented through software, hardware, or both thereof. The embodiments of the present invention may further include a computer-readable storage medium for bearing or storing instructions readable or executable by a computer, or for storing data instructions. The program may be stored in a computer-readable storage medium such as ROM/RAM, magnetic disk, and compact disk. When being executed, the program generated out of the instructions stored in the storage medium may cover part or all of the steps in any embodiment of the present invention.

The coder and the decoder under the present invention are detailed below.

A coder is disclosed according to an embodiment of the present invention. The coder may include: (1) a pulse distribution obtaining unit, adapted to obtain the pulse distribution, on a track, of all the pulses to be encoded on the track; (2) a distribution identifier determining unit, adapted to determine a distribution identifier for identifying the pulse distribution, according to the pulse distribution obtained by the pulse distribution obtaining unit; and (3) a coding index generating unit, adapted to generate a coding index that includes the distribution identifier determined by the distribution identifier determining unit.

The pulse distribution obtained by the pulse distribution obtaining unit may include the information about the distribution of the pulse positions on the track.

The distribution identifier determining unit may include: (1) a comparing unit, adapted to compare the pulse distribution with all possible distributions of the pulse positions on the track; and (2) an obtaining unit, adapted to obtain a distribution identifier corresponding to the pulse distribution compared by the comparing unit, wherein each possible distribution of the pulse positions corresponds to a distribution identifier.

The pulse distribution may include: quantity of pulse positions, distribution of pulse positions on the track, and quantity of pulses in each pulse position.

The distribution identifier may carry information about the first index, the second index, and the third index, where: (1) the first index is adapted to identify the information about all possible distributions of the pulse positions on the track when the quantity of pulse positions is the same; (2) the second index is adapted to identify the instance of distribution corresponding to the current pulse position among all possible distributions corresponding to the first index; and (3) the third index is adapted to identify the information about the quantity of pulses in each pulse position.

The distribution identifier determining unit may include: (1) a first determining unit, adapted to determine the first index according to the quantity of pulse positions; (2) a second determining unit, adapted to determine the second index according to the distribution of pulse positions on the track; and (3) a third determining unit, adapted to determine the third index according to the quantity of pulses in each pulse position.

The coder may further include: a permuting unit, adapted to: permute all the possible distributions of the pulse positions on the track in a set order with respect to the current quantity of pulses before the comparing unit compares the pulse distribution with the information about all possible distributions of the pulse positions on the track, or before the second determining unit determines the second index according to the distribution of pulse positions on the track, where the permuting number in the permutation serves as a distribution index indicative of the distribution.

The pulse distribution obtaining unit may also obtain the pulse sign information indicative of the positive and negative features of the pulse when obtaining the pulse distribution about how all the pulses to be encoded on the track are distributed on the track. The distribution identifier determining unit may also determine the pulse sign identifier corresponding to the pulse sign information when determining the distribution identifier. The coding index generated by the coding index generating unit may also include the pulse sign identifier corresponding to each pulse.

A coder is disclosed according to an embodiment of the present invention. The coder may include: (1) a pulse sum determining unit, adapted to determine the total quantity of pulses to be encoded on a track; (2) a coding mode selecting unit, adapted to select a coding mode according to the total quantity of pulses determined by the pulse sum determining unit; and (3) a coding unit, adapted to perform coding in the coding mode selected by the coding mode selecting unit.

The coding unit may include: (1) a pulse distribution obtaining unit, adapted to obtain pulse distribution about how all the pulses to be encoded on a track are distributed on the track; (2) a distribution identifier determining unit, adapted to determine a distribution identifier for identifying the pulse distribution according to the pulse distribution obtained by the pulse distribution obtaining unit; and (3) a coding index generating unit, adapted to generate a coding index that includes the distribution identifier determined by the distribution identifier determining unit.

The pulse distribution may include the information about the distribution of the pulse positions on the track.

The distribution identifier determining unit may include: (1) a comparing unit, adapted to compare the pulse distribution with the information about all possible distributions of the pulse positions on the track; and (2) an obtaining unit, adapted to obtain a distribution identifier corresponding to the pulse distribution compared by the comparing unit, where the information about each possible distribution corresponds to a distribution identifier.

The coder may further include a permuting unit, adapted to: permute all possible distributions of the pulse positions on the track in a set order with respect to the current quantity of pulses before the comparing unit compares the pulse distribution with the information about all possible distributions of the pulse positions on the track, where the permuting number in the permutation serves as a distribution index indicative of the distribution.

The pulse distribution may include: quantity of pulse positions, distribution of pulse positions on the track, and quantity of pulses on each pulse position.

The distribution identifier may carry information about the first index, the second index, and the third index, where: (1) the first index is adapted to identify the information about all possible distributions of the pulse positions on the track when the quantity of pulse positions is the same; (2) the second index is adapted to identify the instance of distribution corresponding to the current pulse position among all possible distributions corresponding to the first index; and (3) the third index is adapted to identify the information about the quantity of pulses in each pulse position.

The distribution identifier determining unit may include: (1) a first determining unit, adapted to determine the first index according to the quantity of pulse positions; (2) a second determining unit, adapted to determine the second index according to the distribution of pulse positions on the track; and (3) a third determining unit, adapted to determine the third index according to the quantity of pulses in each pulse position.

The coder may further include a permuting unit, adapted to: permute all possible distributions of the pulse positions on the track in a set order with respect to the current quantity of pulses before the second determining unit determines the second index according to the distribution of pulse positions on the track, where the permuting number in the permutation serves as a distribution index indicative of the distribution.

The pulse distribution obtaining unit may also obtain the pulse sign information indicative of the positive and negative features of the pulse when obtaining the pulse distribution about how all the pulses to be encoded on the track are distributed on the track. The distribution identifier determining unit may also determine the pulse sign identifier corresponding to the pulse sign information when determining the distribution identifier. The coding index generated by the coding index generating unit may also include the pulse sign identifier corresponding to each pulse.

A decoder is disclosed according to an embodiment of the present invention. The decoder may include: (1) a coding index receiving unit, adapted to receive a coding index; (2) a distribution identifier extracting unit, adapted to obtain a distribution identifier from the coding index received by the coding index receiving unit, wherein the distribution identifier is configured to identify the pulse distribution, on a track, of all the pulses to be encoded on the track; (3) a pulse distribution determining unit, adapted to determine the pulse distribution, on a track, of all the pulses to be encoded on the track, according to the distribution identifier obtained by the distribution identifier extracting unit; and (4) a pulse order reconstructing unit, adapted to reconstruct the pulse order on the track according to the pulse distribution determined by the pulse distribution determining unit.

The pulse distribution may include the information about the distribution of the pulse positions on the track.

The pulse distribution determining unit may include:

a comparing unit, adapted to compare the distribution identifier with the distribution identifier corresponding to all the possible distributions of the pulse positions on the track; and an obtaining unit, adapted to obtain a distribution corresponding to the distribution identifier compared by the comparing unit, where each distribution identifier corresponds to the information about each possible distribution.

The distribution identifier may carry information about the first index, the second index, and the third index; where the first index is adapted to identify the information about all possible distributions of the pulse positions on the track when the quantity of pulse positions is the same;

the second index is adapted to identify the instance of distribution corresponding to the current pulse position among all possible distributions corresponding to the first index; and the third index is adapted to identify the information about the quantity of pulses in each pulse position.

The pulse distribution may include: quantity of pulse positions, distribution of pulse positions on the track, and quantity of pulses on each pulse position.

The distribution identifier extracting unit may include:

a first extracting unit, adapted to extract the first index from the coding index; and a second extracting unit, adapted to extract the second index and the third index from the coding index.

The pulse distribution determining unit includes:

a first determining unit, adapted to determine the quantity of pulse positions according to the first index;

a second determining unit, adapted to determine the distribution of pulse positions on the track according to the second index with respect to the quantity of pulse positions corresponding to the first index; and a third determining unit, adapted to determine the quantity of pulses in each pulse position according to the third index.

The distribution identifier extracting unit may also extract the pulse sign identifier indicative of the positive and negative features of the pulse from the coding index when extracting the distribution identifier from the coding index. The pulse distribution determining unit may also determine the corresponding pulse sign information according to the pulse sign identifier when determining the pulse distribution according to the distribution identifier. The pulse order reconstructing unit may recover the positive or negative feature of the pulse according to the pulse sign information when reconstructing the pulse order on the track.

A decoder is disclosed according to an embodiment of the present invention. The decoder may include: (1) a coding index receiving unit, adapted to receive a coding index; (2) a pulse sum determining unit, adapted to determine the total quantity of pulses encoded on the track with respect to the coding index received by the coding index receiving unit; (3) a decoding mode selecting unit, adapted to select a decoding mode according to the total quantity of pulses determined by the pulse sum determining unit; and (4) a decoding unit, adapted to perform decoding in the decoding mode selected by the decoding mode selecting unit.

The decoding unit may include: (1) a distribution identifier extracting unit, adapted to extract the distribution identifier from the coding index received by the coding index receiving unit, where the distribution identifier identifies the pulse distribution about how all the pulses to be encoded on a track are distributed on the track; (2) a pulse distribution determining unit, adapted to determine the pulse distribution about how all the pulses to be encoded on a track are distributed on the track according to the distribution identifier extracted by the distribution identifier extracting unit; and (3) a pulse order reconstructing unit, adapted to reconstruct the pulse order on the track according to the pulse distribution determined by the pulse distribution determining unit.

The pulse distribution may include the information about the distribution of the pulse positions on the track.

The pulse distribution determining unit may include: (1) a comparing unit, adapted to compare the distribution identifier with the distribution identifier corresponding to all possible distributions of the pulse positions on the track; and (2) an obtaining unit, adapted to obtain pulse distribution corresponding to the distribution identifier compared by the comparing unit, where each distribution identifier corresponds to the information about a possible instance of distribution.

The distribution identifier may carry information about the first index, the second index, and the third index, where: (1) the first index is adapted to identify the information about all possible distributions of the pulse positions on the track when the quantity of pulse positions is the same; (2) the second index is adapted to identify the instance of distribution corresponding to the current pulse position among all possible distributions corresponding to the first index; and (3) the third index is adapted to identify the information about the quantity of pulses in each pulse position.

The pulse distribution may include: quantity of pulse positions, distribution of pulse positions on the track, and quantity of pulses on each pulse position.

The distribution identifier extracting unit may include: (1) a first extracting unit, adapted to extract the first index from the coding index; and (2) a second extracting unit, adapted to extract the second index and the third index from the coding index.

The pulse distribution determining unit may include: (1) a first determining unit, adapted to determine the quantity of pulse positions according to the first index; (2) a second determining unit, adapted to determine the distribution of pulse positions on the track according to the second index with respect to the quantity of pulse positions corresponding to the first index; and (3) a third determining unit, adapted to determine the quantity of pulses in each pulse position according to the third index.

The distribution identifier extracting unit may also extract the pulse sign identifier indicative of the positive and negative features of the pulse from the coding index when extracting the distribution identifier from the coding index. The pulse distribution determining unit may also determine the corresponding pulse sign information according to the pulse sign identifier when determining the pulse distribution according to the distribution identifier. The pulse order reconstructing unit may recover the positive or negative feature of the pulse according to the pulse sign information when reconstructing the pulse order on the track.

The coder and the decoder under the present invention are detailed below by reference to accompanying drawings.

Figure 13:
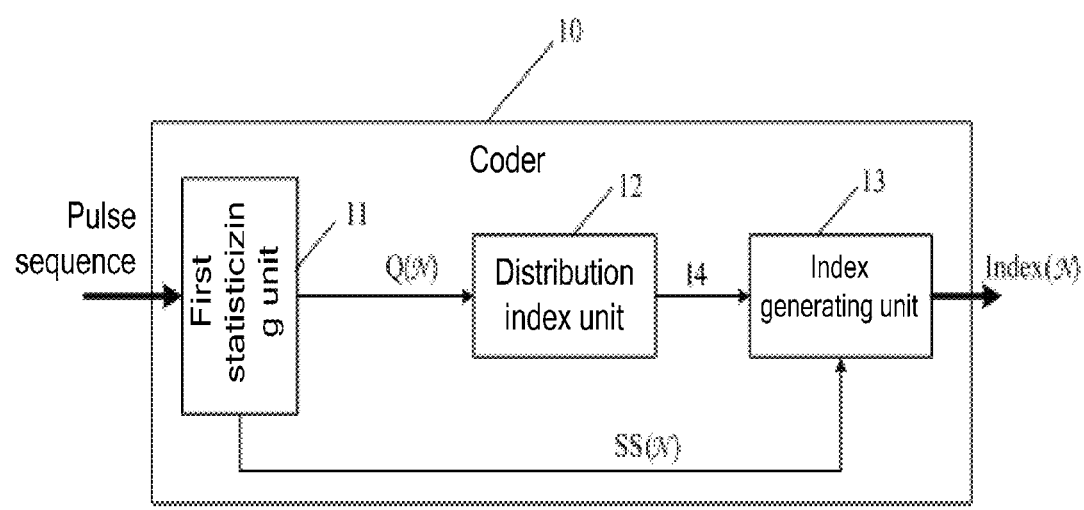
FIG. 13 shows a logical structure of a coder according to a thirteenth embodiment of the present invention.

A coder 10 is disclosed in the thirteenth embodiment of the present invention. As shown in FIG. 13, the coder includes: a first statistic unit 11, a distribution index unit 12, and an index generating unit 13, where: (1) the first statistic unit 11 is adapted to collect the statistics of the pulses to be encoded on a track to obtain pulse distribution about how the position of each pulse is distributed on the track, where the pulse distribution is represented by Q(N). When collecting the statistics of the pulse with a sign, the first statistic unit 11 outputs the sign index information SS(N) corresponding to each pulse according to the positive or negative feature of the pulse sign of each pulse, where the sign index indicates the pulse sign of the pulse corresponding to the index; (2) the distribution index unit 12 is adapted to determine the distribution index I4 according to the Q(N) obtained by the first statistic unit 11. The I4 is calculated in this way: All possible distributions of the positions of all the pulses on the track are permuted in a set order with respect to the current quantity of pulses; and the permuting number in the permutation serves as a distribution index I4 indicative of the distribution; and (3) the index generating unit 13 is adapted to generate a coding index Index(N) that includes the information about the distribution index I4 determined by the distribution index unit 12. When encoding the pulse with a sign, the index generating unit 13 combines the sign index information SS(N) corresponding to each pulse into the Index(N).

The coding apparatus disclosed in this embodiment is applicable to the coding methods disclosed in the first embodiment and the second embodiment.

Figure 14:
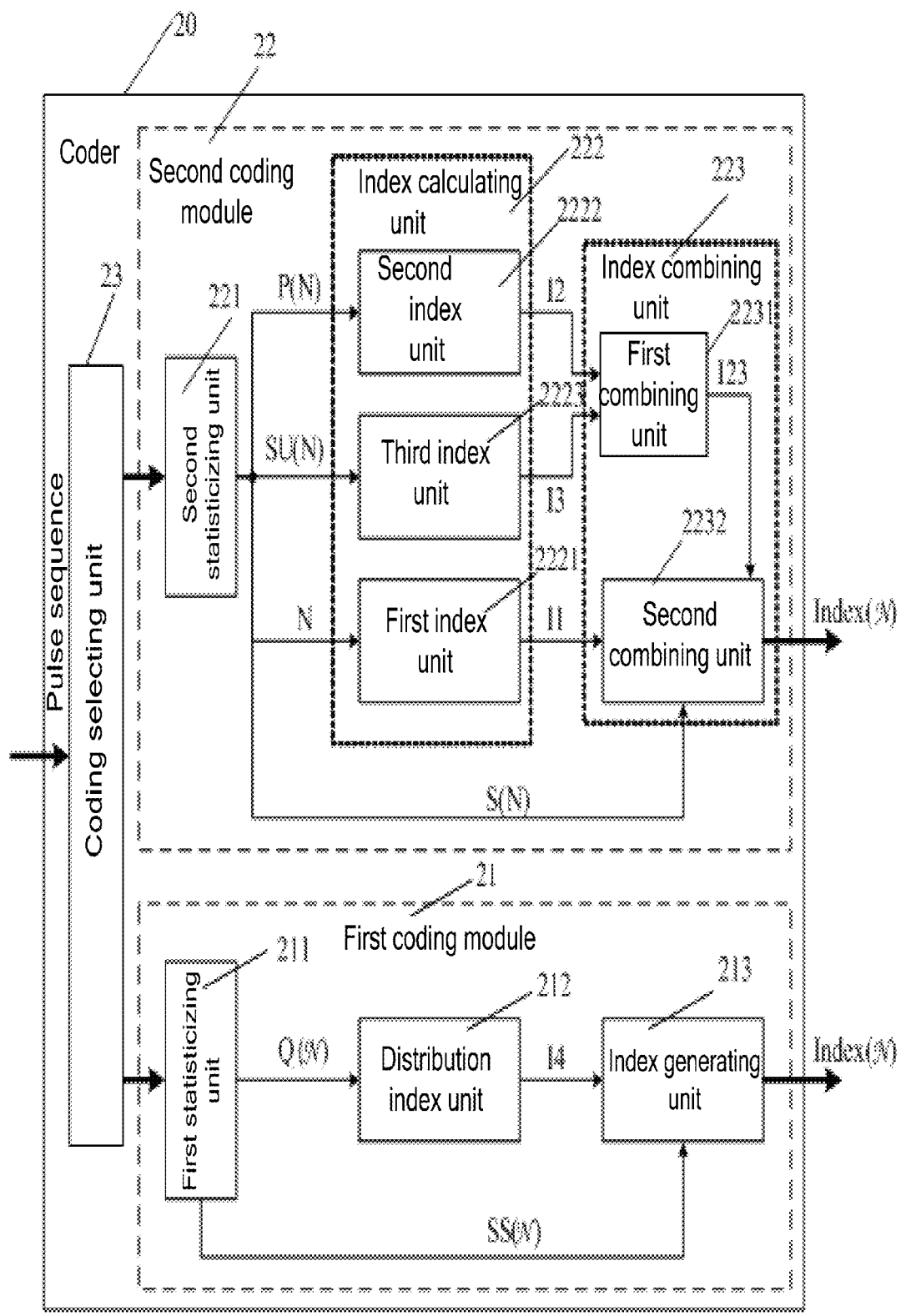
FIG. 14 shows a logical structure of a coder according to a fourteenth embodiment of the present invention.

The fourteenth embodiment provides a coder 20. As shown in FIG. 14, the coder includes: a first coding module 21, a second coding module 22, and a coding selecting unit 2.

The coding selecting unit 23 is adapted to: determine the total quantity (N) of pulses to be encoded on the same track, and select a coding mode according to N, the total quantity. In this embodiment, optional coding modes include a first coding mode and a second coding mode. Depending on the result of selecting the coding mode, the first coding module 21 is triggered to perform coding if the first coding mode is selected; or the second coding module 22 is triggered to perform coding if the second coding mode is selected.

The first coding module 21 includes a first statistic unit 211, a distribution index unit 212, and an index generating unit 213. The logical structure of such units is the same as that of the counterpart units in the 13th embodiment.

The second coding module 22 includes a second statistic unit 221, an index calculating unit 222, and an index combining unit 223.

The second statistic unit 221 is adapted to: collect the statistics of the pulses to be encoded on a track according to positions; and output the quantity (N) of pulse positions, the P(N) and the SU(N), where P(N) represents the distribution of each pulse position on the track, and SU(N) represents the quantity of pulses in each pulse position. When collecting the statistics of the pulse with a sign, the second statistic unit 221 also outputs the corresponding pulse sign information S(N) according to the positive or negative feature of the pulse sign of each pulse position.

The index calculating unit 222 includes: a first index unit 2221, a second index unit 2222, a third index unit 2223, and an index combining unit 223.

The first index unit 2221 is adapted to output the first index I1 according to the quantity (N) of pulse positions. The first index I1 corresponds to all possible distributions of the pulse positions on the track when N is the same.

The second index unit 2222 is adapted to output the second index I2 according to distribution of the pulse positions on the track, where the distribution is expressed by P(N). The second index I2 indicates the instance of distribution corresponding to the distribution of the current pulse position among all possible distributions corresponding to the first index.

The third index unit 2223 is adapted to output the third index according to the quantity of pulses in each pulse position, namely, according to SU(N).

The index combining unit 223 is adapted to combine the information about the first index, the second index, and the third index to generate a coding index. If the pulse to be encoded includes a sign, the index combining unit 223 further combines the sign index information S(N) corresponding to each pulse position into the coding index, where the sign index indicates the pulse sign information of the pulse position corresponding to the sign index.

If the coding index structure is provided in the second coding mode in the third embodiment, the index combining unit 223 for coding may include: (1) a first combining unit 2231, adapted to output the second index and the third index combined into I23, namely, I23=I3×W(N)+I2, where W(N) represents the total quantity of all possible distributions of the pulse positions on the track, and N represents the quantity of pulse positions corresponding to the first index; and (2) a second combining unit 2232, adapted to: overlay the output of the first combining unit 2231 with information about other indices, and output the coding index Index(N).

The coding apparatus disclosed in this embodiment is applicable to the coding methods disclosed in the third embodiment and the fourth embodiment.

Figure 15:
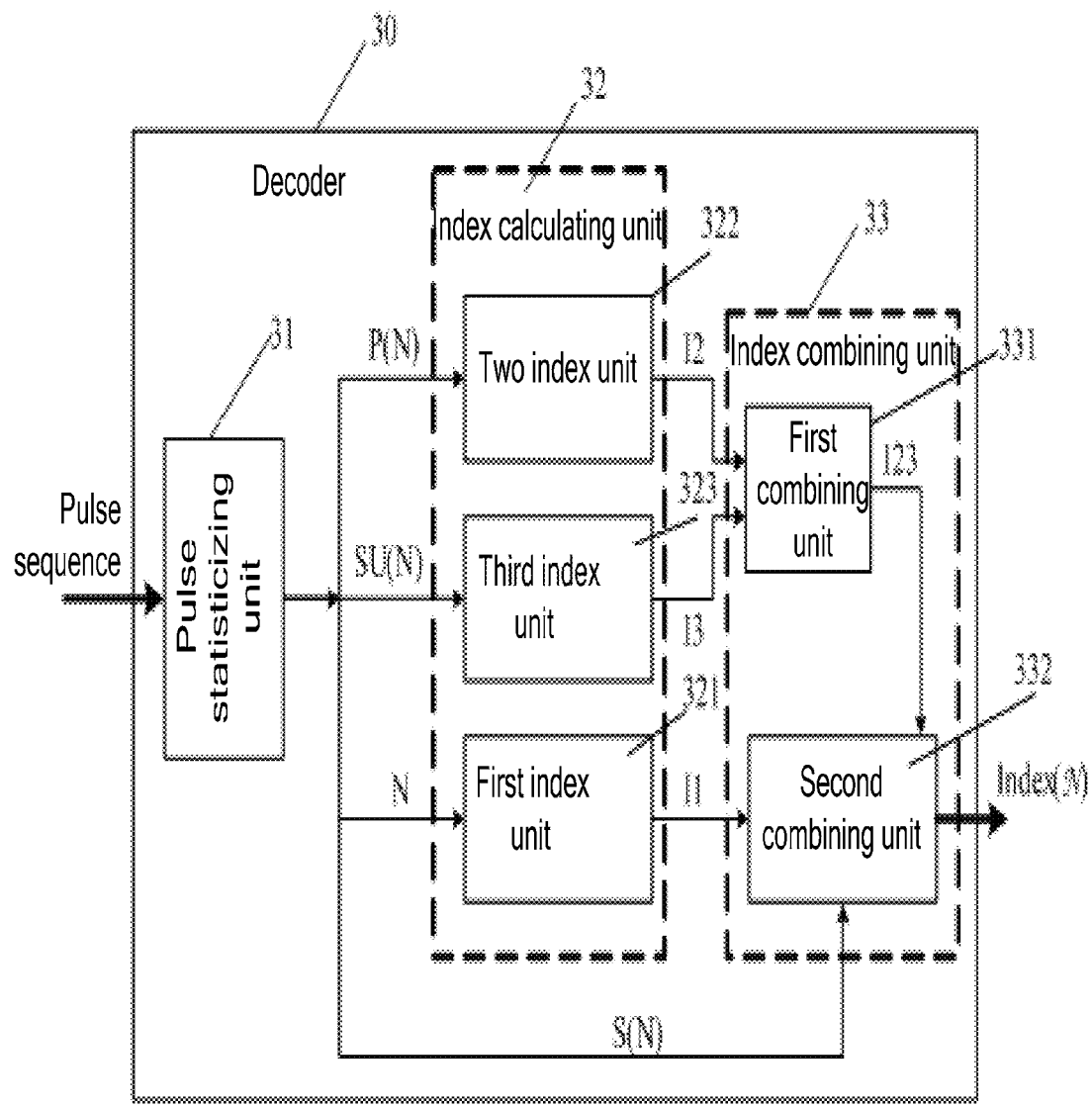
FIG. 15 shows a logical structure of a coder according to a fifteenth embodiment of the present invention.

A coder 30 is disclosed in the fifteenth embodiment. As shown in FIG. 15, the coder includes: a pulse statistic unit 31, an index calculating unit 32, and an index combining unit 33. The pulse statistic unit 31 is adapted to: collect the statistics of the pulses to be encoded on a track according to positions; and output the quantity (N) of pulse positions, the P(N) and the SU(N), where: P(N) represents the distribution of each pulse position on the track, and SU(N) represents the quantity of pulses in each pulse position. When collecting the statistics of the pulse with a sign, the pulse statistic unit 31 also outputs the corresponding pulse sign information S(N) according to the positive or negative feature of the pulse sign of each pulse position. The index calculating unit 32 includes: a first index unit 321, a second index unit 322, and a third index unit 323. The first index unit 321 is adapted to output the first index I1 according to the quantity (N) of pulse positions. The first index I1 corresponds to all possible distributions of the pulse positions on the track when N is the same. The second index unit 322 is adapted to output the second index I2 according to distribution of the pulse positions on the track, where the distribution is expressed by P(N). The second index I2 indicates the instance of distribution corresponding to the distribution of the current pulse position among all possible distributions corresponding to the first index. And the third index unit 323 is adapted to output the third index according to the quantity of pulses in each pulse position, namely, according to SU(N). The index combining unit 33 is adapted to: combine the information about the first index, the second index, and the third index to generate a coding index. If the pulse to be encoded includes a sign, the index combining unit 33 further combines sign index information S(N) corresponding to each pulse position into the coding index, where the sign index indicates the pulse sign information of the pulse position corresponding to the sign index.

When the pulses are encoded according to the coding index structure provided in the fifth embodiment, the index combining unit 33 may include: (1) a first combining unit 331, adapted to output the second index and the third index combined into I23, namely, I23=I3×W(N)+I2, where W(N) represents the total quantity of all possible distributions of the pulse positions on the track, and N represents the quantity of pulse positions corresponding to the first index; and (2) a second combining unit 332, adapted to: overlay the output of the first combining unit 331 with information about other indices, and output the coding index Index(N).

The coding apparatus disclosed in this embodiment is applicable to the coding methods disclosed in the fifth embodiment and the sixth embodiment.

Figure 16:
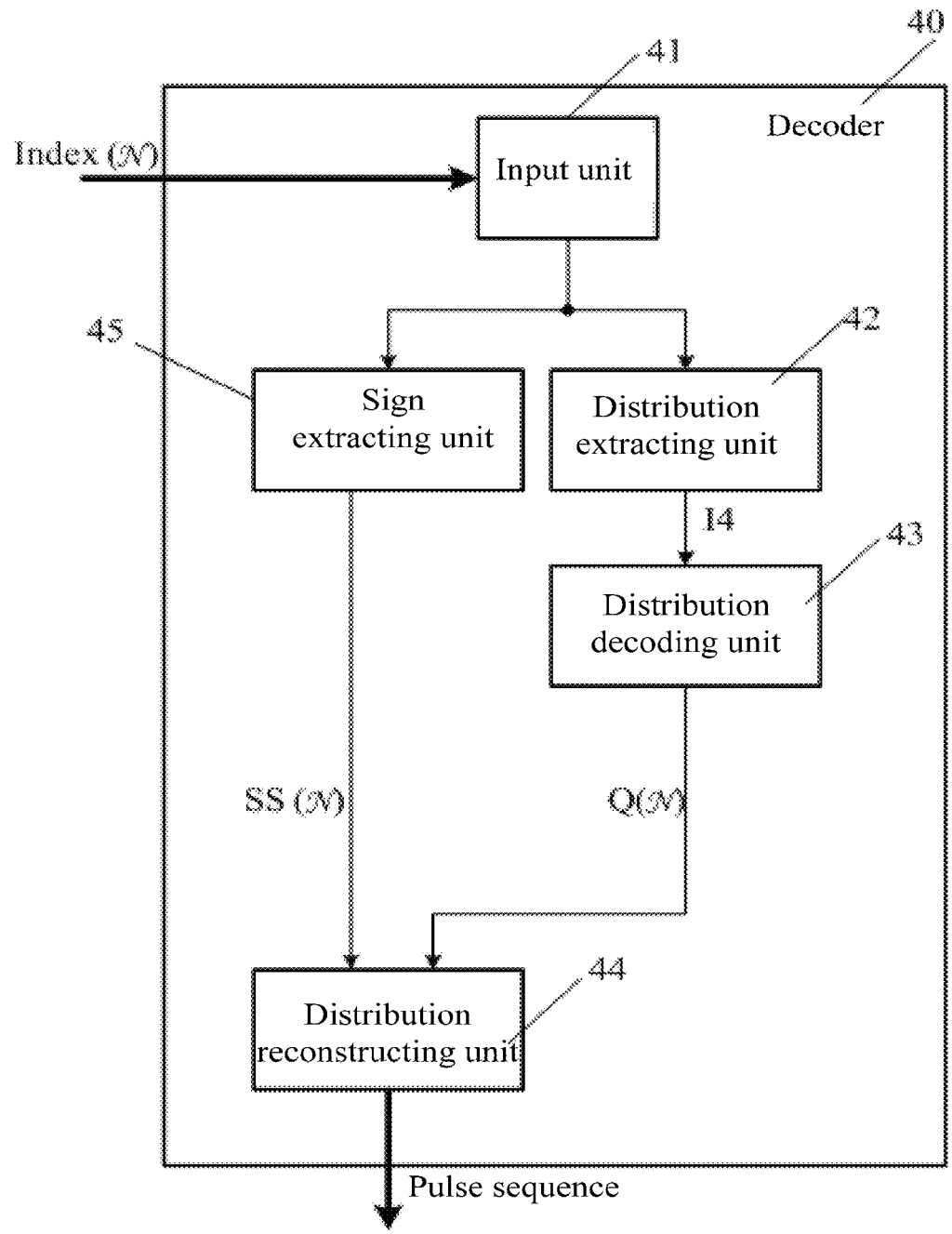
FIG. 16 shows a logical structure of a decoder according to a sixteenth embodiment of the present invention.

A decoder 40 is disclosed in the sixteenth embodiment. As shown in FIG. 16, the decoder includes: (1) a receiving unit 41, adapted to receive a coding index Index(N); (2) a distribution extracting unit 42, adapted to extract the distribution index I4 from the Index(N) received by the receiving unit 41; (3) a distribution decoding unit 43, adapted to determine the distribution of each pulse position on the track according to the distribution index I4 extracted by the distribution extracting unit 42, where the distribution is represented by Q(N); and (4) a distribution reconstructing unit 44, adapted to reconstruct the pulse order on the track according to the Q(N) determined by the distribution decoding unit 43, where Q(N) represents the distribution of each pulse position on the track.

If the pulse to be decoded includes a sign, the decoder needs to further include a sign extracting unit 45, adapted to extract the sign index SS(N) corresponding to each pulse from the Index(N) received by the receiving unit 31 according to the total quantity (N) of pulses to be encoded on the same track, where the sign index indicates the pulse sign information of the pulse corresponding to the sign index.

In this case, the distribution reconstructing unit 44 further recovers the positive or negative feature of the pulse sign of each pulse according to the pulse sign information indicated by the SS(N) extracted by the sign extracting unit 45.

The decoding apparatus disclosed in this embodiment is applicable to the decoding methods disclosed in the seventh embodiment and the eighth embodiment.

Figure 17:
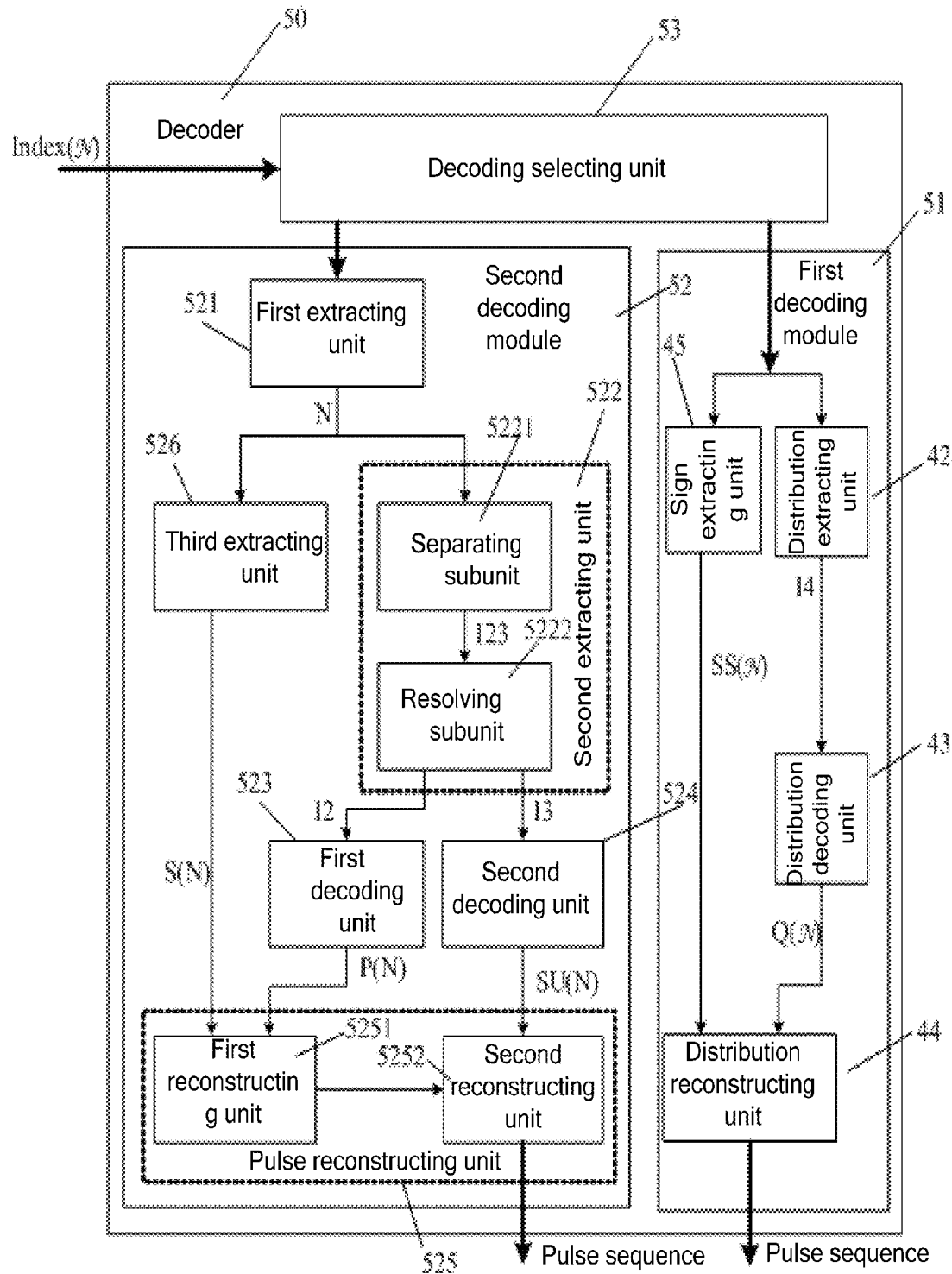
FIG. 17 shows a logical structure of a decoder according to a seventeenth embodiment of the present invention.

The seventeenth embodiment provides a decoder 50. As shown in FIG. 17, the decoder includes: a first decoding module 51, a second decoding module 52, and a decoding selecting unit 53.

The decoding selecting unit 53 is adapted to: determine the total quantity (N) of pulses encoded on the same track by the received coding index Index(N), and select a decoding mode according to N, the total quantity. Optional decoding modes in this embodiment include a first decoding mode and a second decoding mode. Depending on the result of selecting the decoding mode, the first decoding module 51 is triggered to perform decoding if the first decoding mode is selected; or the second decoding module 52 is triggered to perform decoding if the second decoding mode is selected.

The first decoding module 51 includes a distribution extracting unit 512, a distribution decoding unit 513, a distribution reconstructing unit 514, and a sign extracting unit 515.

The logical structure of such units is the same as that of the counterpart units in the 16th embodiment.

The second decoding module 52 includes: (1) a first extracting unit 521, adapted to: receive the coding index Index(N), extract the first index I1 from the Index(N), and determine the quantity (N) of pulse positions according to the I1; and (2) a second extracting unit 522, adapted to extract the second index I2 and the third index I3 from the coding index Index(N).

If the coding index structure is provided in the second coding mode in the third embodiment, the second extracting unit 522 for decoding may include: (1) a separating subunit 5221, adapted to extract the combination value I23 of the second index and the third index from the coding index; (2) a resolving subunit 5222, adapted to separate and output the second index I2 and the third index I3 in the following way:

$$I2=I23\% W(N), I3=\mathrm{Int}[I23/W(N)],$$

where W(N) represents the total quantity of all possible distributions of the pulse positions on the track, N represents the quantity of pulse positions corresponding to the first index, % refers to taking the remainder, and Int refers to taking the integer; (a) a first decoding unit 523, adapted to determine the P(N) according to the second index I2 with respect to the quantity of pulse positions corresponding to the I1, where P(N) represents the distribution of the pulse position on the track; (b) a second decoding unit 524, adapted to determine the SU(N) according to the third index I3, where SU(N) represents the quantity of pulses in each pulse position; and (3) a pulse reconstructing unit 525, adapted to reconstruct the pulse order on the track according to the P(N) and the SU(N), where: P(N) represents distribution of pulse positions on the track, and SU(N) represents the quantity of pulses in each pulse position.

If the pulse to be decoded includes a sign, the decoder needs to further include a third extracting unit 526, adapted to extract the sign index s(n) corresponding to each pulse position from the Index(N) according to the quantity (N) of pulses, where the sign index indicates the pulse sign information of the pulse position corresponding to the sign index.

In this case, the pulse reconstructing unit 525 may include: (1) a first reconstructing unit 5251, adapted to recover the positive or negative feature of the pulse sign of each pulse position according to the P(N) and the s(n), where P(N) represents distribution of pulse positions on the track, and s(n) represents the sign index corresponding to each pulse position; and (2) a second reconstructing unit 5252, adapted to reconstruct the pulse order on the track according to the distribution of pulse positions and signs output by the first reconstructing unit 5251, and according to the SU(N) which represents the quantity of pulses in each pulse position.

The decoding apparatus disclosed in this embodiment is applicable to the decoding methods disclosed in the ninth embodiment and the 10th embodiment.

Figure 18:
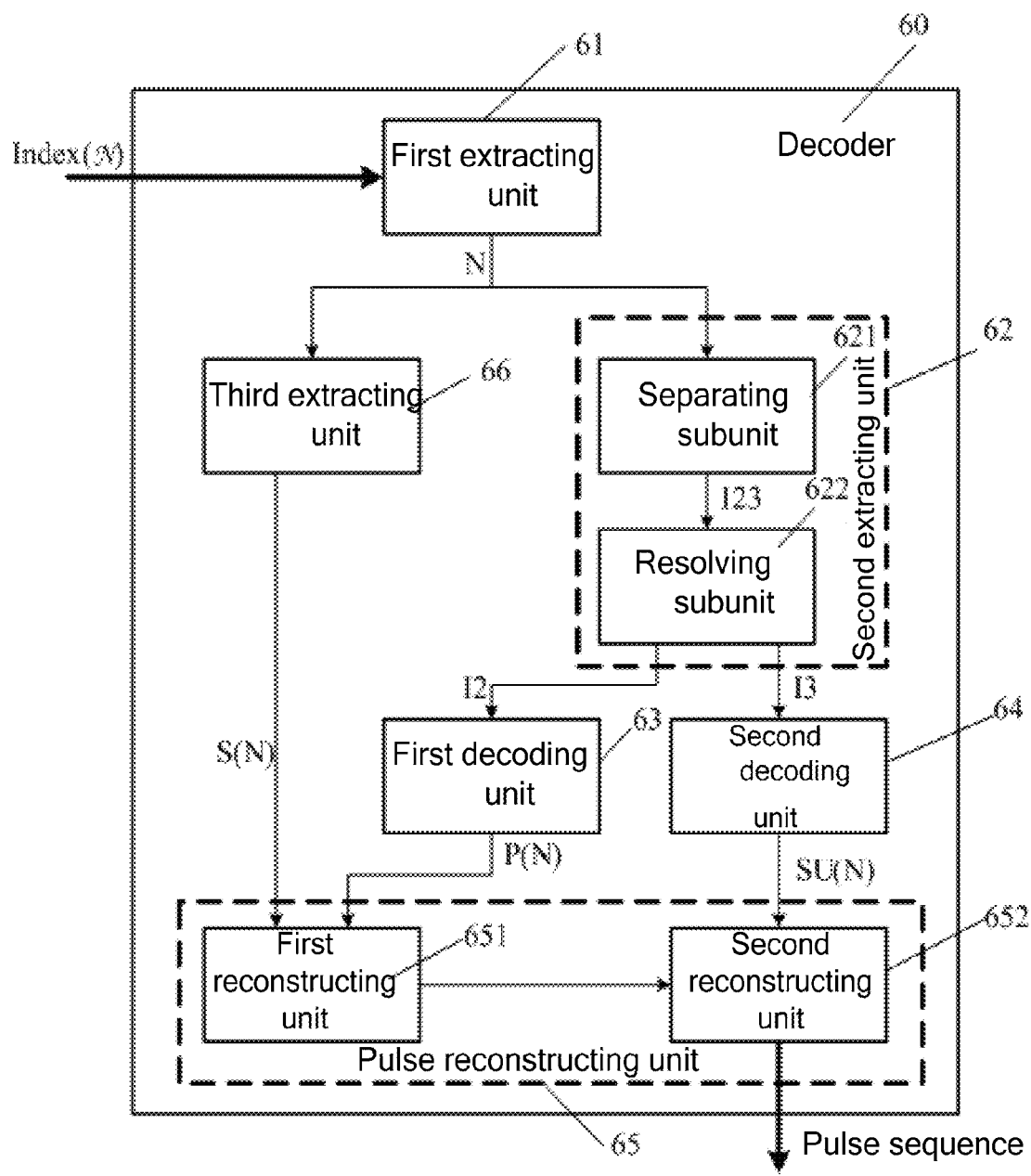
FIG. 18 shows a logical structure of a decoder according to an eighteenth embodiment of the present invention.

A decoder 60 is disclosed in the eighteenth embodiment. As shown in FIG. 18, the decoder includes: (1) a first extracting unit 61, adapted to: receive the coding index Index(N), extract the first index I1 from the Index(N), and determine the quantity (N) of pulse positions according to the I1; and (2) a second extracting unit 62, adapted to extract the second index I2 and the third index I3 from the coding index Index(N).

In the case of decoding the coding index structure provided in the fifth embodiment, the second extracting unit 62 may include: (1) a separating subunit 621, adapted to extract the combination value I23 of the second index and the third index from the coding index; (2) a resolving subunit 622, adapted to separate and output the second index I2 and the third index I3 in the following way:

$$I2 = I23\% \, W(N), I3 = \text{Int}[I23/W(N)],$$

where W(N) represents the total quantity of all possible distributions of the pulse positions on the track, N represents the quantity of pulse positions corresponding to the first index, % refers to taking the remainder, and Int refers to taking the integer; (a) a first decoding unit 63, adapted to determine the P(N) according to the second index I2 with respect to the quantity of pulse positions corresponding to the I1, where P(N) represents the distribution of the pulse position on the track; (b) a second decoding unit 64, adapted to determine the SU(N) according to the third index I3, where SU(N) represents the quantity of pulses in each pulse position; and (3) a pulse reconstructing unit 65, adapted to reconstruct the pulse order on the track according to the P(N) and the SU(N), where: P(N) represents distribution of pulse positions on the track, and SU(N) represents the quantity of pulses in each pulse position.

If the pulse to be decoded includes a sign, the decoder needs to further include a third extracting unit 66, adapted to extract the sign index s(n) corresponding to each pulse position from the Index(N) according to the quantity (N) of pulses, where the sign index indicates the pulse sign information of the pulse position corresponding to the sign index.

In this case, the pulse reconstructing unit 65 may include: (1) a first reconstructing unit 651, adapted to recover the positive or negative feature of the pulse sign of each pulse position according to the P(N) and the s(n), where: P(N) represents distribution of pulse positions on the track, and s(n) represents the sign index corresponding to each pulse position; and (2) a second reconstructing unit 652, adapted to reconstruct the pulse order on the track according to the distribution of pulse positions and signs output by the first reconstructing unit 651, and according to the SU(N) which represents the quantity of pulses in each pulse position.

The decoding apparatus disclosed in this embodiment is applicable to the decoding methods disclosed in the eleventh embodiment and the twelfth embodiment.

In order to further clarify the foregoing embodiments, coding and decoding examples are given below, where the coding is based on the coding method in the third embodiment (the first coding mode is based on the calculation method in the second embodiment, and the second coding mode is based on the calculation method in the fourth embodiment), and the decoding is based on the decoding method in the ninth embodiment (the first decoding mode is based on the calculation method in the eighth embodiment, and the second decoding mode is based on the calculation method in the 10$^{th}$ embodiment), supposing that the selection condition of the first coding/decoding mode is: N=3, 4, 5; and the total quantity of positions on the track is M=16.

EXAMPLE 1

Coding and Decoding for Pulse Search Results

A. Coding (1) N=6, the second coding mode is determined for the coding, and the Index(N) needs to occupy 21 bits.

(2) Statistics of N, P(N), SU(N), and S(N) are collected.
N=1;
P(1)={p(0)}={2};
SU(1)={su(0)}={6}; and
S(1)={s(0)}={0}.

(3) I1, I2, I3, and I23 are encoded.

According to N=1, it is determined that I1=0x1F0000 by reference to FIG. 5.

According to the calculation method in the fourth embodiment, I2=2.

Class(1)=1, I3=0, and therefore, I23=I2=2.

(4) The Index(N) is generated.

$$\text{Index}(N) = I1 + I23 \times 2^N + s(0) \times 2^{N-1} + s(1) \times 2^{N-2} + \ldots + s(N-1)$$
$$= 0 \times 1F0000 + 2 \times 2 + 0$$
$$= 0 \times 1F0004$$

B. Decoding (1) Index(N)=0x1F0004 is received. N=6 is determined according to the coding length, and the second decoding mode is determined for decoding.

(2) I1, s(n), and I23 are extracted.

According to Index(N)=0x1F0004, it is determined that I1=0x1F0000 and N=1 by reference to FIG. 5.

According to N=1, the last bit of Index(N) is separated, and s(0)=0.

I23 is separated, I23=[Index(N)>>1]−I=2, and ">>k" represents k bits shifted leftward.

(3) I23 is decoded.
according to N=1, W(1)=$C_{16}^{1}$=16.
I3=Int[I23/W(1)]=0, and unique instance corresponding to SU(1) is SU(1)={6}.
I2=I23% W(1)=2; according to the calculation method in the eighth embodiment, P(1)={p(0)}={2}.

(4) The pulse order is recovered.

According to P(1)={2}, SU(1)={6}, and s(0)=0, it is determined that 6 positive pulses exist in position 2. The decoding process is completed.

EXAMPLE 2

Coding and Decoding for Pulse Search Results

A. Coding (1) N=5, the first coding mode is determined for the coding, and the Index(N) needs to occupy 19 bits.

(2) Statistics of Q(N) and SS(N) are collected.
Q(5)={q(0), q(1), q(2), q(3), q(4)}={1, 1, 4, 6, 6}; and
SS(5)={ss(0), ss(1), ss(2), ss(3), ss(4)}={0, 0, 0, 0, 0}.

(3) I4 is encoded.

According to the calculation method in the second embodiment, I4=$C_{20}^{5}$−$C_{20-1}^{5}$+$C_{19-1}^{4}$−$C_{19-1}^{4}$+$C_{18-1}^{3}$−$C_{18-4}^{3}$+$C_{17-4}^{2}$−$C_{17-6}^{2}$+$C_{16-6}^{1}$−$C_{16-6}^{1}$=4215.

(4) The Index(N) is generated.

$$\text{Index}(5) = I4 \times 2^5 + ss(0) \times 2^4 + ss(1) \times 2^4 + \ldots + ss(4)$$
$$= 4215 \times 2^5 + 0$$
$$= 0 \times 20EE0$$

B. Decoding (1) Index(N)=0x20EE0 is received. N=5 is determined according to the coding length, and the first decoding mode is determined for decoding.

(2) Q(N) and SS(N) are extracted.

According to N=5, the last five bits of Index(N) are separated, and ss(0)−ss(4)=0.

I4 is separated. I4=[Index(N)>>5]=4215.

(3) I4 is decoded.

According to the calculation method in the eighth embodiment, Q(5)={1, 1, 4, 6, 6}.

(4) The pulse order is recovered.

According to $Q(5)=\{1, 1, 4, 6, 6\}$ and $ss(0) \sim ss(4)=0$, it is determined that 2 positive pulses exist in position 1; 1 positive pulse exists in position 4; and 2 positive pulses exist in position 6. The decoding process is completed.

The foregoing embodiments reveal that: The pulses to be encoded are ordered according to the distribution of the pulse positions on the track before coding, thus simplifying the calculation; because the coding is performed according to the order, all pulse distributions correspond to continuous coding, thus minimizing the coding redundancy and saving the coding bits. Further, the first coding/decoding mode is integrated with the second coding/decoding mode under the present invention. Therefore, the merits of the two coding modes with different N values complement each other, and the merits are more noticeable.

More coding and decoding examples are given below, where the coding is based on the coding method in the second embodiment and the decoding is based on the decoding method in the fourth embodiment, supposing that the total quantity of positions on the track is M=16.

EXAMPLE 1

Coding and Decoding for Pulse Search Results

A. Coding (1) N=6, and the Index(N) needs to occupy 21 bits.
(2) Statistics of N, P(N), SU(N), and S(N) are collected.
N=1;
$P(1)=\{p(0)\}=\{2\}$;
$SU(1)=\{su(0)\}=\{6\}$; and
$S(1)=\{s(0)\}=\{0\}$.
(3) I1, I2, I3, and I23 are encoded.
According to N=1, it is determined that I1=0x1F0000 by reference to FIG. 5.
According to the calculation method in the sixth embodiment, I2=2.
Class(1)=1, I3=0, and therefore, I23=I2=2.
(4) The Index(N) is generated.

$$\text{Index}(N) = I1 + I23 \times 2^N + s(0) \times 2^{N-1} + s(1) \times 2^{N-2} + \ldots + s(N-1)$$
$$= 0 \times 1F0000 + 2 \times 2 + 0$$
$$= 0 \times 1F0004$$

B. Decoding (1) Index(N)=0x1F0004 is received. N=6 is determined according to the coding length.
(2) I1, s(n), and I23 are extracted.
According to Index(N)=0x1F0004, it is determined that I1=0x1F0000 and N=1.
According to N=1, the last bit of Index(N) is separated, and s(0)=0.
I23 is separated, I23=[Index(N)>>1]−I1=2, and ">>k" represents k bits shifted leftward.
(3) I23 is decoded.
According to N=1, $W(1)=C_{16}^{1}=16$.
I3=Int[I23/W(1)]=0, and unique instance corresponding to SU(1) is SU(1)={6}.
I2=I23% W(1)=2; according to the calculation method in the 12th embodiment, P(1)={p(0)}={2}.
(4) The pulse order is recovered.
According to P(1)={2}, SU(1)={6}, and s(0)=0, it is determined that 6 positive pulses exist in position 2. The decoding process is completed.

EXAMPLE 2

Coding and Decoding for Pulse Search Results

A. Coding (1) N=6, and the Index(N) needs to occupy 21 bits.
(2) Statistics of N, P(N), SU(N), and S(N) are collected.
N=2;
$P(2)32 \{p(0), p(1)\}=\{2, 4\}$;
$SU(2)=\{su(0), su(1)\}=\{2, 4\}$; and
$S(2)=\{s(0), s(1)\}=\{0, 0\}$.
(3) I1, I2, I3, and I23 are encoded.
According to N=2, it is determined that I1=0x1E0000 by reference to FIG. 5.
According to the calculation method in the sixth embodiment, I2=30.
Considering Class(2)=5, supposing that five possible instances of SU(2) are arranged in this order: $\{\{5, 1\}, \{4, 2\}, \{3, 3\}, \{2, 4\}, \text{and} \{1, 5\}\}$, then SU(2)={2, 4} is the fourth instance, and I3=3, and therefore, $I23=I3 \times C_{16}^{2}+I2=390$.
(4) The Index(N) is generated.

$$\text{Index}(N) = I1 + I23 \times 2N + s(0) \times 2N - 1 + s(1) \times 2N - 2 + \ldots + s(N-1)$$
$$= 0 \times 1E0000 + 390 \times 4 + 0 + 0$$
$$= 0 \times 1E0618$$

B. Decoding (1) Index(N)=0x1E0618 is received. N=6 is determined according to the coding length.
(2) I1, s(n), and I23 are extracted.
According to Index(N)=0x1E0618, it is determined that I1=0x1E0000 and N=2 by reference to FIG. 5.
According to N=2, the last two bits of Index(N) are separated, s(0)=0, and s(1)=0.
I23 is separated. I23=[Index(N)>>2]−I1=390.
(3) I23 is decoded.
According to N=2, $W(2)=C_{16}^{2}=120$.
I3=Int[I23/W(2)]=3. According to the order of all the same instances of SU(2) applied at the coder, the fourth instance is matched: SU(2)={2, 4}.
I2=I23% W(2)=30; according to the calculation method in the 12th embodiment, $P(2)32 \{2, 4\}$.
(4) The pulse order is recovered.
According to $P(2)32 \{2, 4\}$, SU(2)={2, 4}, s(0)=0, and s(1)=0, it is determined that 2 positive pulses exist in position 2; and 4 positive pulses exist in position 4. The decoding process is completed.

The foregoing embodiments reveal that: The pulses to be encoded are combined according to positions, and the quantity of pulse positions, distribution of the pulse position on the track, and the quantity of pulses in each pulse position are encoded. To any quantity of pulses to be encoded, the coding method under the present invention is uniformly applicable, thus avoiding increase of the coding index redundancy caused in the recursive mode, and ensuring a high utilization ratio of the coding bits. Meanwhile, it is not necessary to encode multiple pulses in the same position separately. Instead, the positions of pulses are merged before coding, thus saving coding bits. With the increase of the pulses to be encoded on the track, the probability of overlaying pulse positions also increases, and the merits of the embodiments of the prevent invention are more noticeable.

Detailed above are a coding method, a decoding, a coder, and a decoder under the present invention. Although the invention is described through some exemplary embodiments, the invention is not limited to such embodiments. It is apparent that those skilled in the art can make various modifications and variations to the invention without departing from the spirit and scope of the invention. The invention is intended to cover the modifications and variations provided that they fall in the scope of protection defined by the following claims or their equivalents.

What is claimed is:

1. A method for coding, performed by a process unit programmed in an encoder, comprising:
   obtaining the pulse distribution, on a track, of the pulses to be encoded on the track;
   determining a distribution identifier for identifying the pulse distribution, according to the pulse distribution; and
   generating a coding index that comprises the distribution identifier;
   wherein the pulse distribution comprises:
   a distribution of pulse positions on the track; or
   quantity of pulse positions, distribution of pulse positions on the track, and quantity of pulses in each pulse position;
   wherein,
   when the pulse distribution comprises a distribution of pulse positions on the track, wherein determining a distribution identifier for identifying the pulse distribution according to the pulse distribution comprises:
   comparing the pulse distribution with all possible distributions of the pulse positions on the track; and
   obtaining a distribution identifier corresponding to the pulse distribution, wherein each possible distribution of the pulse positions corresponds to a distribution identifier,
   when the pulse distribution comprises the quantity of pulse positions, the distribution of pulse positions on the track, and the quantity of pulses in each pulse position, wherein the distribution identifier comprises:
   a first index, adapted to identify all possible distributions of the pulse positions on the track when the quantity of pulse positions is determined;
   a second index, adapted to identify a distribution, corresponding to the distribution of current pulse position, of all the possible distributions corresponding to the first index; and
   a third index, adapted to identify the quantity of pulses in each pulse position.

2. The method of claim 1, wherein determining a distribution identifier for identifying the pulse distribution according to the pulse distribution comprises:
   determining the first index according to the quantity of pulse positions;
   determining the second index according to the pulse distribution of pulse positions on the track; and
   determining the third index according to the quantity of pulses in each pulse position.

3. The method of claim 1, wherein further comprising:
   permuting all the possible distributions of the pulse positions on the track in a set order with respect to the current quantity of pulses before comparing the pulse distribution with all possible distributions of the pulse positions on the track, or before determining the second index according to the distribution of pulse positions on the track, wherein the permuting number in the permutation serves as a distribution index indicative of the corresponding distribution.

4. The method of claim 3, wherein permuting all the possible distributions of the pulse positions on the track in a set order with respect to the current quantity of pulses comprises:
   obtaining a pulse distribution vector Q(N) with N dimensionality, the pulse distribution vector Q(N) corresponds to the distribution of the pulse positions, and Q(N)={q(0), q(1), . . ., q(N−1)}, wherein N represents the total quantity of pulses to be encoded on the same track, q(h) is a serial number of the position for the $(h+1)^{th}$ pulse, h∈[0, N−1], and q(0)≦q(1)≦ . . . ≦q(N−1) or q(0)≧q(1)≧ . . . ≧q(N−1);
   comparing the values in each dimensions of the Q(N); and
   sequencing all possible pulse distribution vector Q(N) in N dimensionality according to the order from a smaller value to a greater value or from a greater value to a smaller value.

5. The method of claim 4, wherein the distribution identifier I4 for identifying Q(N) after sequencing all the possible values represents:

$$I4 = C_{PPT}^{N} - C_{PPT-q(0)}^{N} + \sum_{h=1}^{N-1} [C_{PPT-h-q(h-1)}^{N-h} - C_{PPT-h-q(h)}^{N-h}],$$

wherein PPT=M+N−1, M represents the total quantity of positions on the track, q(h)∈[0, M−1], C refers to calculating the combination function, and Σ refers to summing.

6. The method of claim 1, wherein the method further comprises:
   obtaining the pulse sign information indicative of the positive and negative features of the pulse when obtaining the pulse distribution on a track; and
   determining the pulse sign identifier corresponding to the pulse sign information when determining the distribution identifier, the coding index further comprises the pulse sign identifier corresponding to each pulse.

7. The method of claim 2, wherein generating a coding index comprises:
   overlaying the information about other indices with the first index used as a start value, a value of the first index corresponds to an independent value range of the coding index,
   when overlaying the information about other indices with the first index used as a start value overlaying the combination of the second index and the third index in the following way,

I3×W(N)+I2;

wherein I2 represents the second index, I3 represents the third index, W(N) represents the total quantity of all possible distributions of the pulse positions on the track, and N represents the quantity of the pulse positions corresponding to the first index.

8. The method of claim 2, wherein:
   the quantity of the pulse positions is in a one-to-one corresponding relation with the first index;
   the total quantity of positions on the track is 16, the quantity of pulses to be coded is 6, when the pulse positions respectively is 1, 2, 3, 4, 5, 6, the first index corresponding to order of the pulse positions is hexadecimal, the first index represents respectively: 1F0000, 1E0000, 1D0000, 180000, 000000, 100000;
   the total quantity of positions on the track is 16, the quantity of pulses to be coded is 5, when the pulse positions respectively is 1, 2, 3, 4, 5, the first index corresponding to order of the pulse positions is hexadecimal, the first index represents respectively: 78000, 70000, 60000, 40000, 00000;

the total quantity of positions on the track is 16, the quantity of pulses to be coded is 4, when the pulse positions respectively is 1, 2, 3, 4, the first index corresponding to order of the pulse positions is hexadecimal, the first index represents respectively: E000, C000, 8000, 0000;

the total quantity of positions on the track is 16, the quantity of pulses to be coded is 3, when the pulse positions respectively is 1, 2, 3, the first index corresponding to order of the pulse positions is hexadecimal, the first index represents respectively: 1C00, 1800, 0000; or the total quantity of positions on the track is 16, the quantity of pulses to be coded is 2, when the pulse positions respectively is 1, 2, the first index corresponding to order of the pulse positions is hexadecimal, the first index represents respectively: 1E0, 000.

9. The method of claim 1, wherein, before obtaining a pulse distribution on a track the method further comprises:
   determining the total quantity of pulses to be encoded on the track; and
   selecting a coding mode according to the total quantity of pulses, the coding mode comprises each steps of claim 1, 10. A method for decoding, performed by a process unit programmed in a decoder, comprising:
   receiving a coding index;
   obtaining a distribution identifier from the coding index, wherein the distribution identifier is configured to identify the pulse distribution, on a track, of the pulses encoded on the track;
   determining the pulse distribution, on a track, of pulses encoded on the track according to the distribution identifier; and
   reconstructing the pulse order on the track according to the pulse distribution;
   wherein,
   the pulse distribution comprises: distribution of the pulse position on the track,
   wherein determining the pulse distribution on the track according to the distribution identifier comprises:
   comparing the distribution identifier with a distribution identifier corresponding to all the possible distributions of the pulse positions on the track; and
   obtaining a distribution corresponding to the distribution identifier, wherein each distribution identifier corresponds to each possible pulse distribution.

11. The method of claim 10, wherein the distribution identifier comprises:
   a first index, adapted to identity all possible distributions of the pulse positions on the track when the quantity of pulse positions is determined;
   a second index, adapted to identify a distribution, corresponding to the distribution of current pulse position, of all the possible distributions corresponding to the first index; and
   a third index, adapted to identify the quantity of pulses in each pulse positions.

12. The method of claim 11, wherein,
   obtaining the distribution identifier from the coding index comprises:
   extracting the first index from the coding index; and
   extracting the second index and the third index from the coding index;
   wherein determining the pulse distribution on a track according to the distribution identifier comprises:
   determining the quantity of pulse positions according to the first index;
   determining the distribution of pulse positions on the track according to the second index with respect to the quantity of pulse positions corresponding to the first index; and
   determining the quantity of guises in each pulse position according to the third index.

13. The method of claim 12, wherein, extracting the second index and the third index from the coding Index comprises:
   extracting the combination value I23 of the second index and the third index from the coding index;
   separating and obtaining the second index I2 and the third index I3 in the following way:

$$I2 = I23 \% W(N), I3 = \text{Int}[I23/W(N)]; \text{ and}$$

wherein I2 represents the second index, I3 represents the third index, W(N) represents the total quantity of all possible distributions of the pulse positions on the track, N represents the quantity of the pulse positions corresponding to the first index, % refers to taking the remainder, and Int refers to taking the integer.

14. The method of claim 12, wherein, determining the distribution of pulse positions on the track according to the second index comprises:
   subtracting the total value of $C_{M-1}^{N-1}, \ldots,$ and $C_{M-y0}^{N-1}$ from the second index I2 one by one, until the I2 remainder R(y0) changes from a positive number to a negative number, wherein M is the total quantity of positions on the track, N is the quantity of pulse positions, $y0 \in [1, M-N+1]$, and C refers to calculating the combination function, and the p(0) records the serial number of the first pulse position on the track, wherein p(0)=y0−1;
   subtracting the total value of $C_{M-p(0)-1}^{N-2}, \ldots,$ and $C_{M-p(0)-y1}^{N-2}$ from R[p(0)] one by one until the R[p(0)] remainder R1(x1) changes from a positive number to a negative number, if N>1, and recording, by the p(1), the serial number of the first pulse position on the track, wherein p(1)=y1−1;
   by analogy, subtracting the total value of $C_{M-p(0)- \ldots -p(n-1)-1}^{N-n-2}, \ldots,$ and $C_{M-p(0)- \ldots -p(n-1)-yn}^{N-n-2}$ from R(n−1)[p(n−1)] one by one until the R(n−1)[p(n−1)] remainder Rn(yn) changes from a positive number to a negative number, where n≦N−1, recording, by and the p(n), the serial number of the first pulse position on the track, wherein p(n)=yn−1.

15. The method of claim 10, comprising:
   extracting the pulse sign identifier indicative of the positive and negative features of the pulse from the coding index when extracting the distribution identifier from the coding index;
   determining the corresponding pulse sign information according to the pulse sign identifier when determining the pulse distribution according to the distribution identifier; and
   recovering the positive or negative feature of the pulse according to the pulse sign information when reconstructing the pulse order on the track.

16. The method of claim 12, wherein, extracting the first index from the coding Index comprises:
   judging the value range of the coding Index among several set independent value ranges; and
   determining :he first index according to the starting value of such a value range.

17. The method of claim 10, wherein, after receiving a coding index and before obtaining the distribution identifier from the coding index, the method further comprises:
- determining the total quantity of pulses encoded on the track with respect to the coding index;
- selecting a decoding mode according to the total quantity of pulses, wherein the selected decoding mode comprises:
- extracting the distribution identifier from the coding index, wherein the distribution identifier identifies the pulse distribution of the pulses encoded on the track; and
- reconstructing the pulse order on the track according to the pulse distribution.

* * * * *

UNITED STATES PATENT AND TRADEMARK OFFICE
CERTIFICATE OF CORRECTION

PATENT NO.        : 8,294,602 B2                                    Page 1 of 1
APPLICATION NO.   : 12/607723
DATED             : October 23, 2012
INVENTOR(S)       : Ma et al.

It is certified that error appears in the above-identified patent and that said Letters Patent is hereby corrected as shown below:

Column 33, line 25, the "," at the end of the sentence should be replaced with a ".".

Column 34, line 9, "guises" should read -- pulses --.

Signed and Sealed this
Nineteenth Day of February, 2013

Teresa Stanek Rea
*Acting Director of the United States Patent and Trademark Office*